(12) United States Patent
Kho et al.

(10) Patent No.: US 10,588,238 B2
(45) Date of Patent: Mar. 10, 2020

(54) APPARATUS, SYSTEM, AND METHOD FOR PARTITIONING A STORAGE-SYSTEM CHASSIS

(71) Applicant: Facebook, Inc., Menlo Park, CA (US)

(72) Inventors: Chuankeat Kho, San Jose, CA (US); Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/708,069

(22) Filed: Sep. 18, 2017

(65) Prior Publication Data
US 2019/0090374 A1 Mar. 21, 2019

(51) Int. Cl.
*H05K 7/14* (2006.01)
*H05K 7/20* (2006.01)
(Continued)

(52) U.S. Cl.
CPC ......... *H05K 7/1489* (2013.01); *G11B 33/126* (2013.01); *G11B 33/128* (2013.01);
(Continued)

(58) Field of Classification Search
CPC ............. H05K 7/1489; H05K 7/20727; H05K 7/1487; H05K 5/0021; H05K 5/0208; H05K 7/1409; G06F 12/1466
(Continued)

(56) References Cited

U.S. PATENT DOCUMENTS

| 3,601,463 | A | * | 8/1971 | Watt | ................ | A47B 71/00 220/592.09 |
| 3,996,500 | A | | 12/1976 | Coules | | |

(Continued)

OTHER PUBLICATIONS

Acoustic Attenuation; https://en.wikipedia.org/wiki/Acoustic_attenuation; Oct. 22, 2012.
(Continued)

*Primary Examiner* — Jayprakash N Gandhi
*Assistant Examiner* — Stephen S Sul
(74) *Attorney, Agent, or Firm* — FisherBroyles, LLP

(57) ABSTRACT

A multi-purpose storage-system partition may include (1) a bottom having a keyhole fastener configured to (a) interlock with a keyhole opening of a removable drive-plane board having front storage-drive connectors and rear storage-drive connectors and (b) retain the removable drive-plane board within a storage-system chassis, (2) a front having front storage-drive contact points configured to (a) retain front carrierless storage drives within the storage-system chassis and (b) align the front carrierless storage drives with the front storage-drive connectors, (3) a rear having rear storage-drive contact points configured to (a) retain rear carrierless storage drives within the storage-system chassis and (b) align the rear carrierless storage drives with the rear storage-drive connectors, (4) and a side having a fastener-retaining member configured to engage a fastener that couples the multi-purpose storage-system partition to a side of the storage-system chassis. Various other systems and methods for partitioning a storage-system chassis are also disclosed.

20 Claims, 24 Drawing Sheets

(51) Int. Cl.
*G11B 33/14* (2006.01)
*G11B 33/12* (2006.01)

(52) U.S. Cl.
CPC ......... *G11B 33/142* (2013.01); *H05K 7/1487* (2013.01); *H05K 7/20727* (2013.01)

(58) Field of Classification Search
USPC ............ 361/679.01, 679.02, 679.31–679.33, 361/679.37–679.39, 679.4, 679.48, 361/679.58, 724–726, 729–733, 740, 742, 361/747, 759
See application file for complete search history.

(56) References Cited

U.S. PATENT DOCUMENTS

| | | | |
|---|---|---|---|
| D294,800 S | 3/1988 | Nilsson | |
| 4,969,065 A | 11/1990 | Petri | |
| 5,262,705 A | 11/1993 | Hattori | |
| 5,281,149 A | 1/1994 | Petri | |
| 5,724,803 A | 3/1998 | Pea | |
| 5,793,614 A | 8/1998 | Tollbom | |
| 5,957,659 A | 9/1999 | Amou | |
| 6,021,044 A | 2/2000 | Neville, Jr. et al. | |
| 6,109,767 A | 8/2000 | Rodriguez | |
| 6,116,375 A | 9/2000 | Lorch | |
| 6,159,031 A | 12/2000 | Llapitan | |
| 6,181,549 B1 | 1/2001 | Mills | |
| 6,331,915 B1 | 12/2001 | Myers | |
| 6,385,051 B1* | 5/2002 | Perez | G06F 1/18 361/726 |
| 6,404,646 B1 | 6/2002 | Tsai | |
| 6,469,899 B2 | 10/2002 | Hastings | |
| 6,515,854 B1 | 2/2003 | Claprood | |
| 6,552,915 B2 | 4/2003 | Takahashi et al. | |
| 6,621,692 B1 | 9/2003 | Johnson | |
| 6,695,629 B1* | 2/2004 | Mayer | H05K 7/142 361/752 |
| 6,791,843 B1 | 9/2004 | Dobbs | |
| 6,798,669 B1 | 9/2004 | Hsu | |
| 6,813,165 B2 | 11/2004 | Cheng | |
| 6,987,674 B2 | 1/2006 | El-Batal | |
| 6,995,982 B2 | 2/2006 | Gonzalez | |
| 7,004,764 B2 | 2/2006 | Boudreau | |
| 7,084,654 B2 | 8/2006 | Zhao | |
| 7,088,579 B1 | 8/2006 | Konshak | |
| 7,167,371 B2 | 1/2007 | Coles | |
| 7,301,778 B1 | 11/2007 | Fang | |
| 7,304,855 B1 | 12/2007 | Milligan et al. | |
| 7,411,787 B2 | 8/2008 | Katakura | |
| 7,423,354 B2 | 9/2008 | Suzuki et al. | |
| 7,505,286 B2 | 3/2009 | Brovald | |
| 7,515,413 B1 | 4/2009 | Curtis | |
| 7,649,750 B2 | 1/2010 | Lee | |
| 8,020,902 B1 | 9/2011 | Li | |
| 8,127,059 B1 | 2/2012 | Carr et al. | |
| 8,203,851 B2 | 6/2012 | Boetzer | |
| 8,310,828 B2 | 11/2012 | Collins | |
| 8,331,095 B2* | 12/2012 | Hu | H05K 7/1487 312/223.1 |
| 8,369,080 B2 | 2/2013 | Huang | |
| 8,517,054 B2 | 8/2013 | Lai et al. | |
| 8,570,720 B2 | 10/2013 | Yao | |
| 8,636,528 B2 | 1/2014 | Sass et al. | |
| 8,657,619 B2 | 2/2014 | Lin | |
| 8,743,549 B2* | 6/2014 | Frink | G06F 1/187 361/724 |
| 8,749,966 B1 | 6/2014 | Boudreau | |
| 8,848,349 B2 | 9/2014 | Ke | |
| 8,944,538 B2 | 2/2015 | Li | |
| 8,971,052 B2 | 3/2015 | Fu | |
| 9,066,438 B2 | 6/2015 | Chen | |
| 9,070,419 B1 | 6/2015 | Zhu | |
| 9,098,233 B2 | 8/2015 | Keffeler | |
| 9,101,210 B2 | 8/2015 | Lin | |
| 9,203,188 B1 | 12/2015 | Siechen | |
| 9,274,548 B2 | 3/2016 | Foisy et al. | |
| 9,298,230 B2* | 3/2016 | Wei | H05K 7/20736 |
| 9,313,909 B1 | 4/2016 | Huang | |
| 9,354,003 B2 | 5/2016 | Lin | |
| 9,448,601 B1* | 9/2016 | Beall | G06F 1/187 |
| 9,454,190 B2 | 9/2016 | Mao et al. | |
| 9,456,519 B2 | 9/2016 | Bailey | |
| 9,461,389 B2 | 10/2016 | Novack | |
| 9,538,684 B2 | 1/2017 | Chen | |
| 9,545,028 B2 | 1/2017 | Hoshino | |
| 9,572,276 B2 | 2/2017 | Haroun | |
| 9,583,877 B1 | 2/2017 | Angelucci | |
| 9,609,778 B1 | 3/2017 | Spencer | |
| 9,763,350 B2 | 9/2017 | Rust | |
| 9,763,353 B1* | 9/2017 | Beall | H05K 7/1488 |
| 9,795,052 B2 | 10/2017 | Hsiao | |
| 9,936,611 B1* | 4/2018 | Beall | H05K 7/20736 |
| 9,949,407 B1 | 4/2018 | Beall | |
| 10,058,006 B2 | 8/2018 | Hung et al. | |
| 10,165,703 B1 | 12/2018 | Adrian | |
| 10,178,791 B1 | 1/2019 | Kho | |
| 10,240,615 B1 | 3/2019 | Kho et al. | |
| 10,264,698 B2 | 4/2019 | Kho et al. | |
| 10,372,360 B2 | 8/2019 | Adrian | |
| 2003/0123221 A1 | 7/2003 | Liao | |
| 2003/0183448 A1 | 10/2003 | Van Sleet | |
| 2003/0200472 A1 | 10/2003 | Midorikawa et al. | |
| 2003/0200475 A1 | 10/2003 | Komoto | |
| 2005/0057205 A1 | 3/2005 | El-Batal et al. | |
| 2005/0136747 A1* | 6/2005 | Caveney | H05K 1/0228 439/676 |
| 2005/0182874 A1 | 8/2005 | Herz et al. | |
| 2005/0238421 A1 | 10/2005 | Doerr | |
| 2006/0075155 A1 | 4/2006 | Fuller et al. | |
| 2006/0134953 A1 | 6/2006 | Williams | |
| 2006/0146507 A1* | 7/2006 | Lee | H05K 7/142 361/758 |
| 2006/0274508 A1 | 12/2006 | Lariviere | |
| 2007/0195542 A1 | 8/2007 | Metros | |
| 2007/0230111 A1 | 10/2007 | Starr | |
| 2007/0233781 A1 | 10/2007 | Starr | |
| 2007/0234081 A1 | 10/2007 | Makino et al. | |
| 2008/0007913 A1 | 1/2008 | Tavassoli | |
| 2008/0117569 A1 | 5/2008 | Lee | |
| 2008/0195786 A1 | 8/2008 | Lee | |
| 2008/0264192 A1* | 10/2008 | Christensen | H05K 1/142 74/469 |
| 2009/0245745 A1 | 10/2009 | Krampotich | |
| 2009/0271950 A1 | 11/2009 | Wang | |
| 2009/0274429 A1 | 11/2009 | Krampotich | |
| 2009/0310303 A1 | 12/2009 | Najbert | |
| 2010/0195304 A1 | 8/2010 | Takao | |
| 2010/0296791 A1 | 11/2010 | Makrides-Saravanos | |
| 2011/0208937 A1 | 8/2011 | Hayashi et al. | |
| 2011/0273850 A1 | 11/2011 | Chen | |
| 2011/0299237 A1 | 12/2011 | Liang | |
| 2011/0309730 A1 | 12/2011 | Retchloff | |
| 2012/0004772 A1 | 1/2012 | Rahilly | |
| 2012/0020006 A1 | 1/2012 | Xu | |
| 2012/0134086 A1 | 5/2012 | Zhang | |
| 2012/0230815 A1 | 9/2012 | Teramoto | |
| 2012/0257360 A1 | 10/2012 | Sun | |
| 2012/0305745 A1 | 12/2012 | Chen | |
| 2012/0320519 A1* | 12/2012 | Wu | H05K 7/1489 361/679.33 |
| 2013/0050955 A1 | 2/2013 | Shinsato et al. | |
| 2013/0058054 A1 | 3/2013 | Zhou | |
| 2013/0258580 A1 | 10/2013 | Nakayama | |
| 2013/0325183 A1 | 12/2013 | Rahilly | |
| 2014/0111930 A1 | 4/2014 | Henderson | |
| 2014/0118936 A1 | 5/2014 | Merlet et al. | |
| 2014/0187068 A1 | 7/2014 | Chia | |
| 2014/0191636 A1 | 7/2014 | Li | |
| 2014/0369002 A1 | 12/2014 | Takeuchi | |
| 2015/0156912 A1 | 6/2015 | Liang | |
| 2015/0163946 A1 | 6/2015 | Kyle | |
| 2015/0208548 A1 | 7/2015 | Chu | |
| 2015/0235673 A1 | 8/2015 | Lo | |

(56) References Cited

U.S. PATENT DOCUMENTS

| | | | |
|---|---|---|---|
| 2015/0380059 A1* | 12/2015 | Bell | G11B 33/08 360/97.19 |
| 2016/0018859 A1 | 1/2016 | Mao et al. | |
| 2016/0042768 A1 | 2/2016 | Yang et al. | |
| 2016/0150659 A1 | 5/2016 | Chen | |
| 2016/0150667 A1 | 5/2016 | Xu | |
| 2016/0330858 A1 | 11/2016 | Ehlen | |
| 2017/0325361 A1* | 11/2017 | Chen | G06F 1/20 |
| 2018/0168071 A1 | 6/2018 | Edge et al. | |
| 2018/0260349 A1 | 9/2018 | Mondal et al. | |
| 2019/0069432 A1* | 2/2019 | Kho | H05K 7/1489 |
| 2019/0069437 A1* | 2/2019 | Adrian | H05K 7/1498 |
| 2019/0069440 A1* | 2/2019 | Adrian | H05K 7/20145 |
| 2019/0073008 A1 | 3/2019 | Adrian | |
| 2019/0075668 A1 | 3/2019 | Adrian et al. | |
| 2019/0079565 A1 | 3/2019 | Adrian | |
| 2019/0090376 A1 | 3/2019 | Kho et al. | |
| 2019/0098795 A1 | 3/2019 | Adrian | |

OTHER PUBLICATIONS

Electromagnetic Shielding; https://en.wikipedia.org/wiki/Electromagnetic_shielding; May 15, 2016.

Jason David Adrian et al.; Apparatus, System, and Method for Reconfigurable Media-Agnostic Storage; U.S. Appl. No. 15/694,068, filed Sep. 1, 2017.

Jason David Adrian; Apparatus, System, and Method for Indicating the Status of and Securing Hard Drives; U.S. Appl. No. 15/700,112, filed Sep. 9, 2017.

Jason David Adrian; Apparatus, System, and Method for Directing Air in a Storage-System Chassis; U.S. Appl. No. 15/689,650, filed Aug. 29, 2017.

Jason David Adrian et al.; Apparatus, System, and Method for Enabling Multiple Storage-System Configurations; U.S. Appl. No. 15/688,830, filed Aug. 28, 2017.

Jason David Adrian et al.; Apparatus, System, and Method for Securing Hard Drives in a Storage Chassis; U.S. Appl. No. 15/697,405, filed Sep. 6, 2017.

Jason David Adrian; Apparatus, System, and Method for Detecting Device Types of Storage Devices; U.S. Appl. No. 15/698,540, filed Sep. 7, 2017.

Chuankeat Kho et al.; Removeable Drive-Plane Apparatus, System, and Method; U.S. Appl. No. 15/693,362, filed Aug. 31, 2017.

Chuankeat Kho et al.; Systems and Methods for Mounting Assembly Pull-Handles; U.S. Appl. No. 15/687,406, filed Aug. 25, 2017.

Jason David Adrian; An Apparatus, System, and Method for Reconfiguring Air Flow Through a Chassis; U.S. Appl. No. 15/716,251, filed Sep. 26, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Jan. 31, 2017.

Open Compute Project; http://opencompute.org/; as accessed Sep. 29, 2017.

Jason David Adrian; Data-Center Drawer and Cable Track Assembly; U.S. Appl. No. 15/720,647, filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho; Apparatus, System, and Method for Securing Computing Components to Printed Circuit Boards; U.S. Appl. No. 15/713,607, filed Sep. 23, 2017.

Chuankeat Kho et al.; Apparatus, System, and Method for Dampening Vibrations Generated by Exhaust Fans; U.S. Appl. No. 15/713,609, filed Sep. 23, 2017.

Chuankeat Kho et al.; Apparatus, System, and Method for Resisting Shock to a Data-Center Rack; U.S. Appl. No. 15/708,075, filed Sep. 18, 2017.

\* cited by examiner

APPARATUS, SYSTEM, AND METHOD FOR PARTITIONING A STORAGE-SYSTEM CHASSIS

BACKGROUND

Today, many entities create and manage complex data storage centers capable of storing and accessing hundreds of terabytes of data (e.g., text, image, and video data) that are generated and consumed every day by their users. These complex data storage centers may also need to be capable of creating and storing duplicate copies of this data for disaster-recovery, testing, regulatory, or other purposes. To cope with these storage needs, existing data storage centers often have hundreds or thousands of petabytes of storage capacity.

As needs for storage capacity increase, storage-system providers have attempted to create storage systems that have higher levels of storage density. In some cases, high-density storage systems simply have more storage drives packed into their chassis than their lower-density storage-system counterparts. In a conventional storage-system chassis, a storage drive is typically removably secured within the storage-system chassis using a carrier mechanism that is attached to the storage drive. Unfortunately, as storage-system providers attempt to incorporate more and more storage drives into a storage-system chassis, these carrier mechanisms may present unwanted limitations. For example, conventional carrier mechanisms may occupy significant amounts of space within a storage-system chassis that may be needed for cooling functions and/or that could have otherwise been used for additional storage drives. Additionally, conventional carrier mechanisms may add significant amounts of weight to a storage-system chassis and/or add significant amounts of time to storage-drive servicing tasks.

SUMMARY

As will be described in greater detail below, the instant disclosure describes various apparatus, systems, and methods for partitioning a storage-system chassis. In one example, a multi-purpose storage-system partition may include (1) a bottom that includes a keyhole fastener that is configured to (a) interlock with one of a plurality of keyhole openings of a removable drive-plane board having a front plurality of storage-drive connectors and a rear plurality of storage-drive connectors and (b) retain the removable drive-plane board within a storage-system chassis, (2) a front that includes a front plurality of storage-drive contact points configured to (a) retain a front plurality of carrierless storage drives within the storage-system chassis and (b) align the front plurality of carrierless storage drives with the front plurality of storage-drive connectors, (3) a rear that includes a rear plurality of storage-drive contact points configured to (a) retain a rear plurality of carrierless storage drives within the storage-system chassis and (b) align the rear plurality of carrierless storage drives with the rear plurality of storage-drive connectors, (4) and a side that includes a fastener-retaining member configured to engage a fastener that couples the multi-purpose storage-system partition to a side of the storage-system chassis. In some examples, the keyhole fastener may be oriented downward relative to the storage-system chassis.

In some examples, the front plurality of storage-drive contact points may be configured to dampen movements of the front plurality of carrierless storage drives relative to movements of the storage-system chassis, and the rear plurality of storage-drive contact points may be configured to dampen movements of the rear plurality of carrierless storage drives relative to the movements of the storage-system chassis. In some examples, the front of the multi-purpose storage-system partition may be a multi-shot injection-molded part that includes a substantially rigid plastic portion and a synthetic rubber portion, and the front plurality of storage-drive contact points may be formed from the synthetic rubber portion. Additionally or alternatively, the rear of the multi-purpose storage-system partition may be a multi-shot injection-molded part that includes a substantially rigid plastic portion and a synthetic rubber portion, and the rear plurality of storage-drive contact points may be formed from the synthetic rubber portion.

In some examples, the multi-purpose storage-system partition may include a multi-shot injection-molded part that includes a substantially rigid plastic portion and a synthetic rubber portion, and the keyhole fastener may be formed from the substantially rigid plastic portion. Additionally or alternatively, the multi-purpose storage-system partition may include an injection-molded part and a metal bracket coupled to the injection-molded part and configured to stiffen the multi-purpose storage-system partition.

In some examples, the storage-system chassis may include a front through which air may be able to pass and a rear through which air may be able to pass and a fan coupled to the storage-system chassis that directs an airflow through the storage-system chassis from the front of the storage-system chassis to the rear of the storage-system chassis. In such examples, the multi-purpose storage-system partition may include openings through which the airflow is able to pass. In at least one example, the openings may be slits, and each of the slits may be located between two of the front storage-drive contact points and configured to allow a portion of the airflow to flow between two of the front plurality of carrierless storage drives and two of the rear plurality of carrierless storage drives.

In some examples, the multi-purpose storage-system partition may include an additional plurality of keyhole openings, and each of the additional plurality of keyhole openings may be configured to interlock with a keyhole fastener of a drive-unseating member.

According to various embodiments, a corresponding storage-system drawer may include (1) a chassis, (2) a removeable drive-plane board that includes (a) a plurality of keyhole openings, (b) a front plurality of storage-drive connectors, and (c) a rear plurality of storage-drive connectors, and (3) a multi-purpose storage-system partition coupled to the chassis that includes (a) a bottom that includes a keyhole fastener that is oriented downward relative to the chassis and configured to (i) interlock with one of the plurality of keyhole openings of the removable drive-plane board and (ii) retain the removable drive-plane board within the chassis, (b) a front that includes a front plurality of storage-drive contact points configured to (i) retain a front plurality of carrierless storage drives within the chassis and (ii) align the front plurality of carrierless storage drives with the front plurality of storage-drive connectors, and (c) a rear that includes a rear plurality of storage-drive contact points configured to (i) retain a rear plurality of carrierless storage drives within the chassis and (ii) align the rear plurality of carrierless storage drives with the rear plurality of storage-drive connectors.

In some examples, the front plurality of storage-drive contact points may be configured to dampen movements of the front plurality of carrierless storage drives relative to movements of the chassis, and the rear plurality of storage-drive contact points may be configured to dampen movements of the rear plurality of carrierless storage drives relative to the movements of the chassis. In various examples, the front of the multi-purpose storage-system partition may be a multi-shot injection-molded part that includes a substantially rigid plastic portion and a synthetic rubber portion, and the front plurality of storage-drive contact points may be formed from the synthetic rubber portion. Additionally or alternatively, the rear of the multi-purpose storage-system partition may be a multi-shot injection-molded part that includes a substantially rigid plastic portion and a synthetic rubber portion, and the rear plurality of storage-drive contact points may be formed from the synthetic rubber portion.

In some examples, the multi-purpose storage-system partition may include a multi-shot injection-molded part that includes a substantially rigid plastic portion and a synthetic rubber portion, and the keyhole fastener may be formed from the substantially rigid plastic portion. In at least one example, the multi-purpose storage-system partition may include an injection-molded part and a metal bracket coupled to the injection-molded part and configured to stiffen the multi-purpose storage-system partition.

In some examples, the multi-purpose storage-system partition may include a side having a fastener-retaining member, and the storage-system drawer may include a fastener that may be configured to engage the fastener-retaining member and couple the multi-purpose storage-system partition to a side of the chassis. Additionally or alternatively, the chassis may include a front through which air may be able to pass and a rear through which air may be able to pass, the storage-system drawer may include a fan coupled to the chassis that directs an airflow through the chassis from the front of the chassis to the rear of the chassis, and the multi-purpose storage-system partition may include at least one opening through which the airflow may be able to pass. In some examples, the at least one opening may include a plurality of slits, and each of the plurality of slits may be located between two of the front storage-drive contact points and configured to allow a portion of the airflow to flow between two of the front plurality of carrierless storage drives and two of the rear plurality of carrierless storage drives. In one example, the multi-purpose storage-system partition may include an additional plurality of keyhole openings, and each of the additional plurality of keyhole openings may be configured to interlock with a keyhole fastener of a drive-unseating member.

In addition to the various apparatus and drawer systems described herein, the instant disclosure presents exemplary methods associated with partitioning a storage-system chassis. For example, a method may include (1) molding, as part of a multi-shot injection-molding process, a first portion of a multi-purpose storage-system partition from a substantially rigid plastic and (2) molding, as part of the multi-shot injection-molding process, a second portion of the multi-purpose storage-system partition from a synthetic rubber. In some examples, the first portion of the multi-purpose storage-system partition may include a bottom that includes a keyhole fastener configured to interlock with one of a plurality of keyhole openings of a removable drive-plane board having a plurality of storage-drive connectors and retain the removable drive-plane board within a storage-system chassis, and the second portion of the multi-purpose storage-system partition may include a plurality of storage-drive contact points configured to retain a plurality of carrierless storage drives within the storage-system chassis and align the plurality of carrierless storage drives with the plurality of storage-drive connectors.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
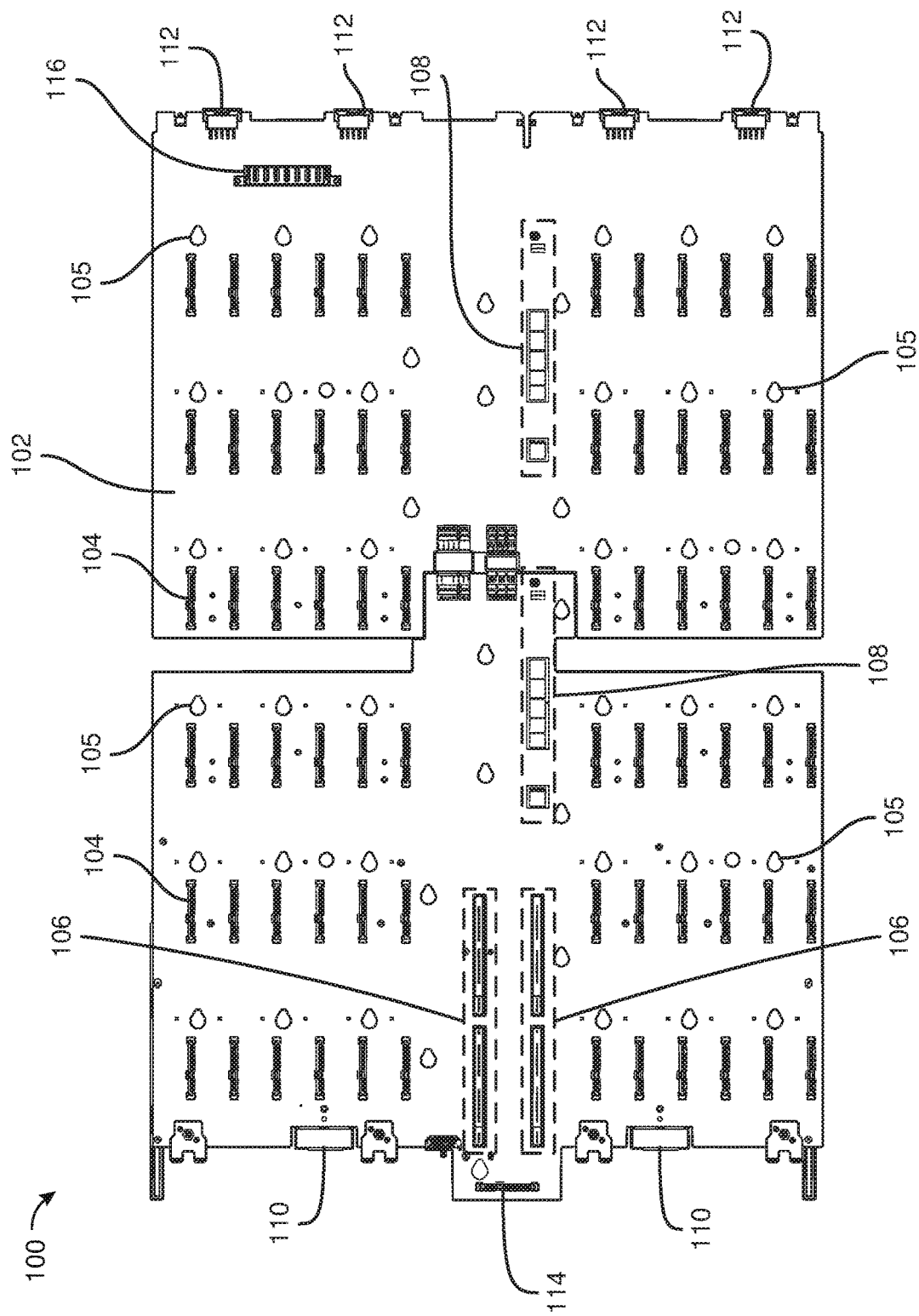
FIG. 1 is a top view of an exemplary removable drive-plane board.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to systems and methods for partitioning a storage-system chassis. As will be explained in greater detail below, the multi-purpose storage-system partitions disclosed herein may be used in a storage-system chassis to (1) secure carrierless storage drives within the storage-system chassis, (2) provide structural support for the storage-system chassis, and/or (3) provide attachment points for other removable storage-system components, such as a removable drive-plane board, within the storage-system chassis. The multi-purpose storage-system partitions disclosed herein may be lightweight double-shot injection-molded partitions that include rubber contact points that securely position carrierless storage drives within the storage-system chassis and provide shock and vibration dampening and isolation for the carrierless storage drives. The multi-purpose storage-system partitions disclosed herein may also include vertical openings that allow air to pass through the storage-system chassis and through the storage drives secured by the multi-purpose storage-system partitions.

Embodiments of the instant disclosure may provide various features and advantages over conventional storage-drive retention mechanisms. For example, the multi-purpose storage-system partitions disclosed herein may offer weight, space, and service-time savings over conventional storage-retention mechanisms by enabling storage drives to be removably secured within a storage-system chassis without a need for carrier mechanisms to be attached to the storage drives. Moreover, the multi-purpose storage-system partitions disclosed herein may offer additional weight and space savings over conventional storage-drive retention mechanisms by performing both storage-drive retention functions and structural-support functions within a storage-system chassis.

The following will provide, with reference to FIGS. 1-4, detailed descriptions of an example removable drive-plane board. Detailed descriptions of an example storage-system drawer will be provided in connection with FIGS. 5-7. Detailed descriptions of example multi-purpose storage-system partitions will be provided in connection with FIGS. 8-22 and 24. Detailed descriptions of an example method for manufacturing a multi-purpose storage-system partition will be provided in connection with FIG. 23.

FIG. 1 shows a top view of an example removable drive-plane board 100. Drive-plane board 100 generally represents any structure that is adapted to connect the various active components (e.g., compute modules, storage drives, storage-controller modules, and input/output modules) that make up a storage system and/or secure the components within a chassis. In some examples, drive-plane board 100 may be one or more printed circuit boards (PCBs) that include various connectors that are electrically connected by conductive traces. In some examples, drive-plane board 100 may be configured to support up to 72 storage drives, up to four fans, drive power control, sensors (e.g., temperature sensors or drawer open sensors), and power distribution.

As shown in FIG. 1, drive-plane board 100 may have a top 102 on which are mounted various types of connectors. In some examples, top 102 may include 72 storage-drive connectors 104, two compute-module connectors 106, two storage-controller connectors 108, two I/O-module connectors 110, four fan module connectors 112, a front-panel connector 114, and a power connector 116. While not shown in FIG. 1, drive-plane board 100 may include electrical conductors that electrically connect some or all of the connectors shown in FIG. 1.

Figure 4:
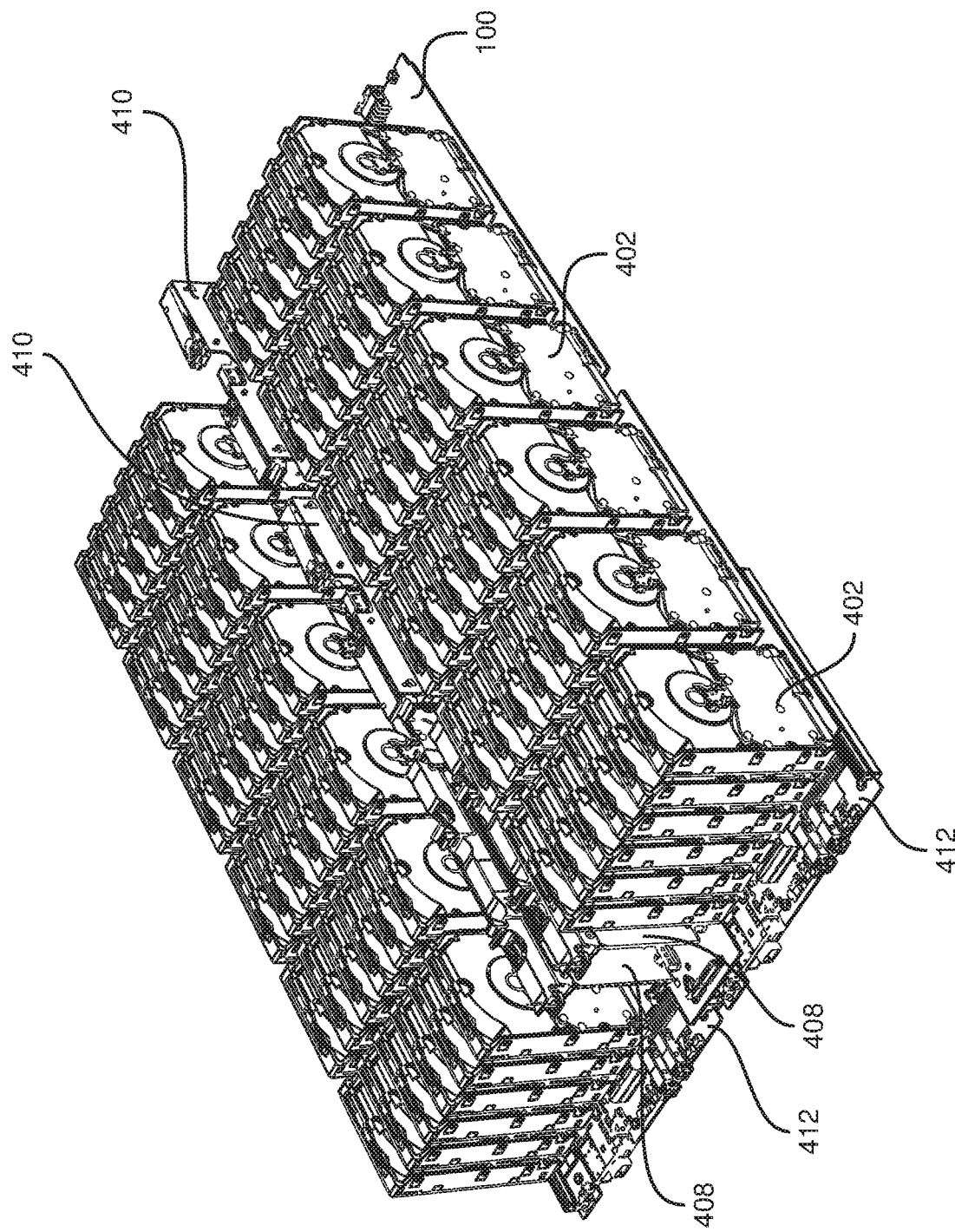
FIG. 4 is a perspective view of exemplary storage-system drives and storage-system modules.

Each of storage-drive connectors 104 may be configured to interface with a single storage drive, such as one of storage drives 402 illustrated in FIG. 4. The term "storage drive," as used herein, generally refers to any device capable of storing electronic data. In some examples, storage-drive connectors 104 may be configured to interface with solid state drives, hard disk drives, and/or optical drives. In some examples, storage-drive connectors 104 may be configured to interface with two or more different types of storage drives. For example, storage-drive connectors 104 may be configured to interface with storage drives that have different physical form factors, that are made up of different types of storage (e.g., solid state or hard disk), that use different protocols, and/or that use different types of connectors. In some examples, storage-drive connectors 104 may be configured to interface with Serial Attached Small computer system interface (SAS) drives, Serial Advanced Technology Attachment (SATA) drives, and/or Non-Volatile Memory express (NVMe) drives. In some examples, storage-drive connectors 104 may be configured to enable hot-swapping of storage drives.

Each of compute-module connectors 106 may be configured to interface with a compute module, such as one of compute modules 408 in FIG. 4. The term "compute module," as used herein, generally refers to any server module whose primary function is computational and/or any server module whose primary function is to provide data storage services. In some examples, compute-module connectors 106 may be configured to interface with two or more different types of compute modules. Each of storage-controller connectors 108 may be configured to interface with a storage-controller module, such as one of storage-controller modules 410 in FIG. 4. The term "storage-controller module," as used herein, generally refers to any storage-system module whose primary function is to control and communicate with storage drives. Each of I/O-module connectors 110 may be configured to interface with an I/O module, such as one of I/O modules 412 in FIG. 4. The term "I/O module," as used herein, generally refers to any storage-system module whose primary function is to facilitate data transfer in and out of a storage system.

Figure 2:
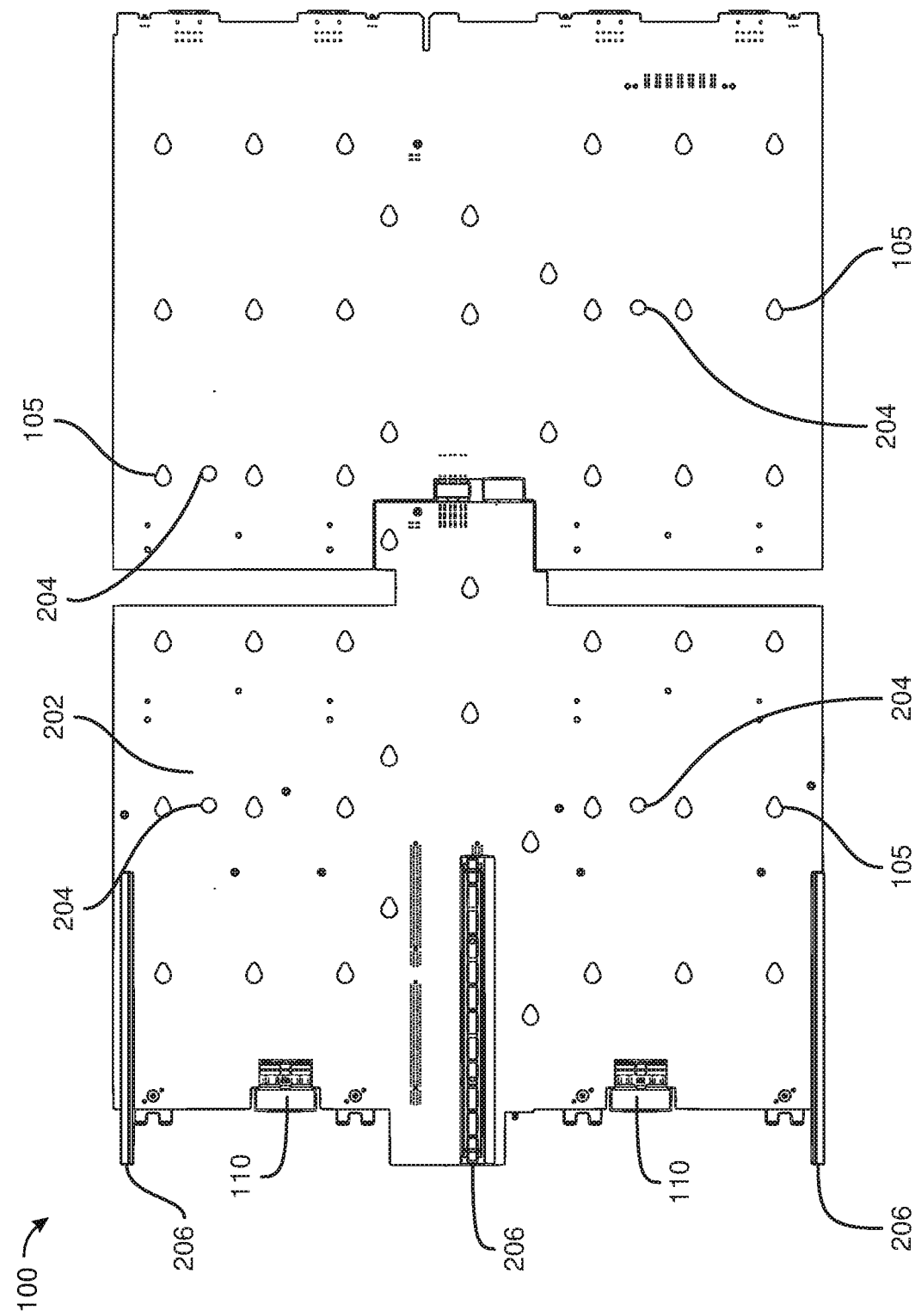
FIG. 2 is a bottom view of the exemplary removable drive-plane board illustrated in FIG. 1.
Figure 3:
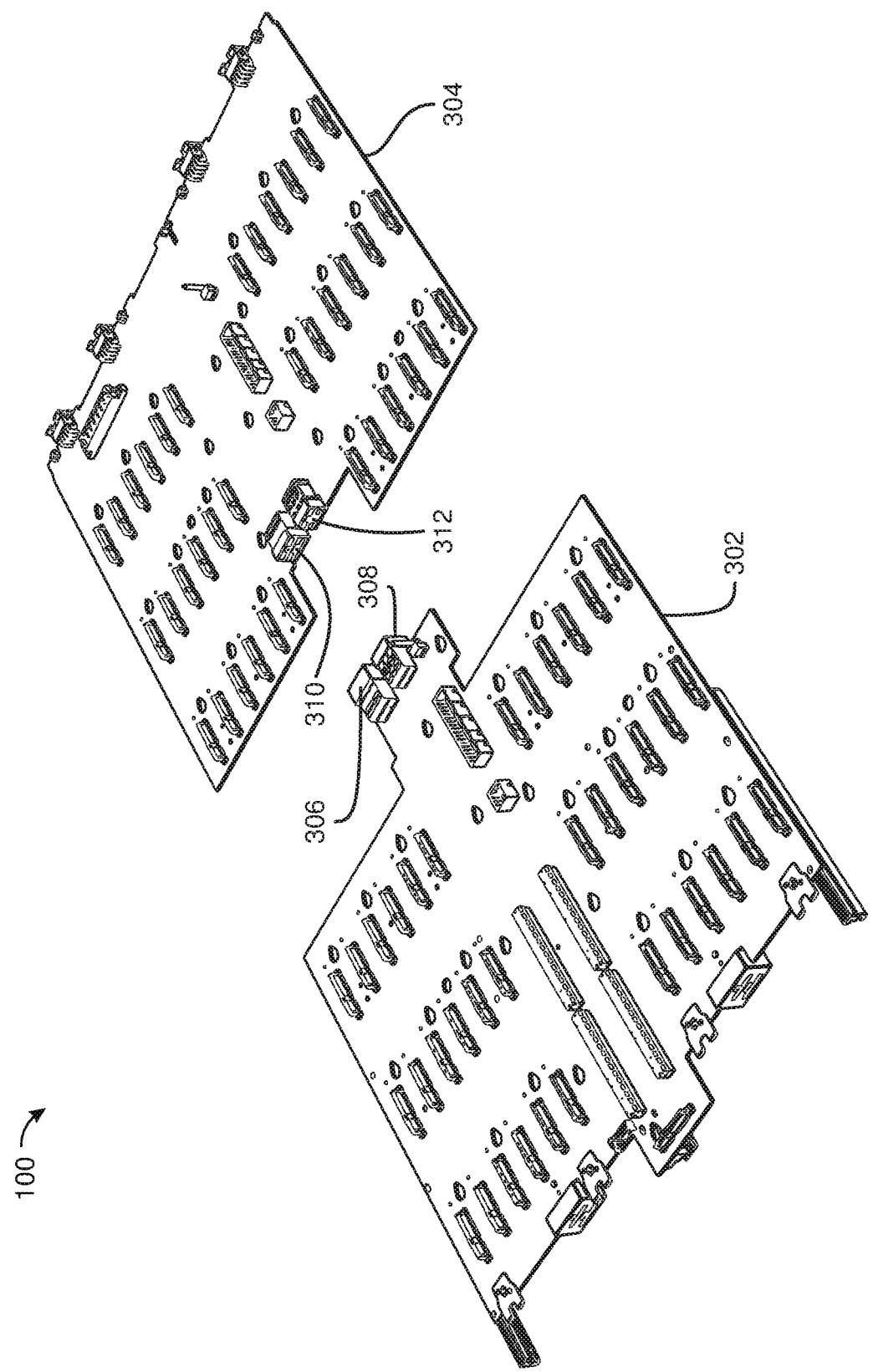
FIG. 3 is a perspective view of the exemplary removable drive-plane board illustrated in FIG. 1 in a disconnected state.
Figure 7:
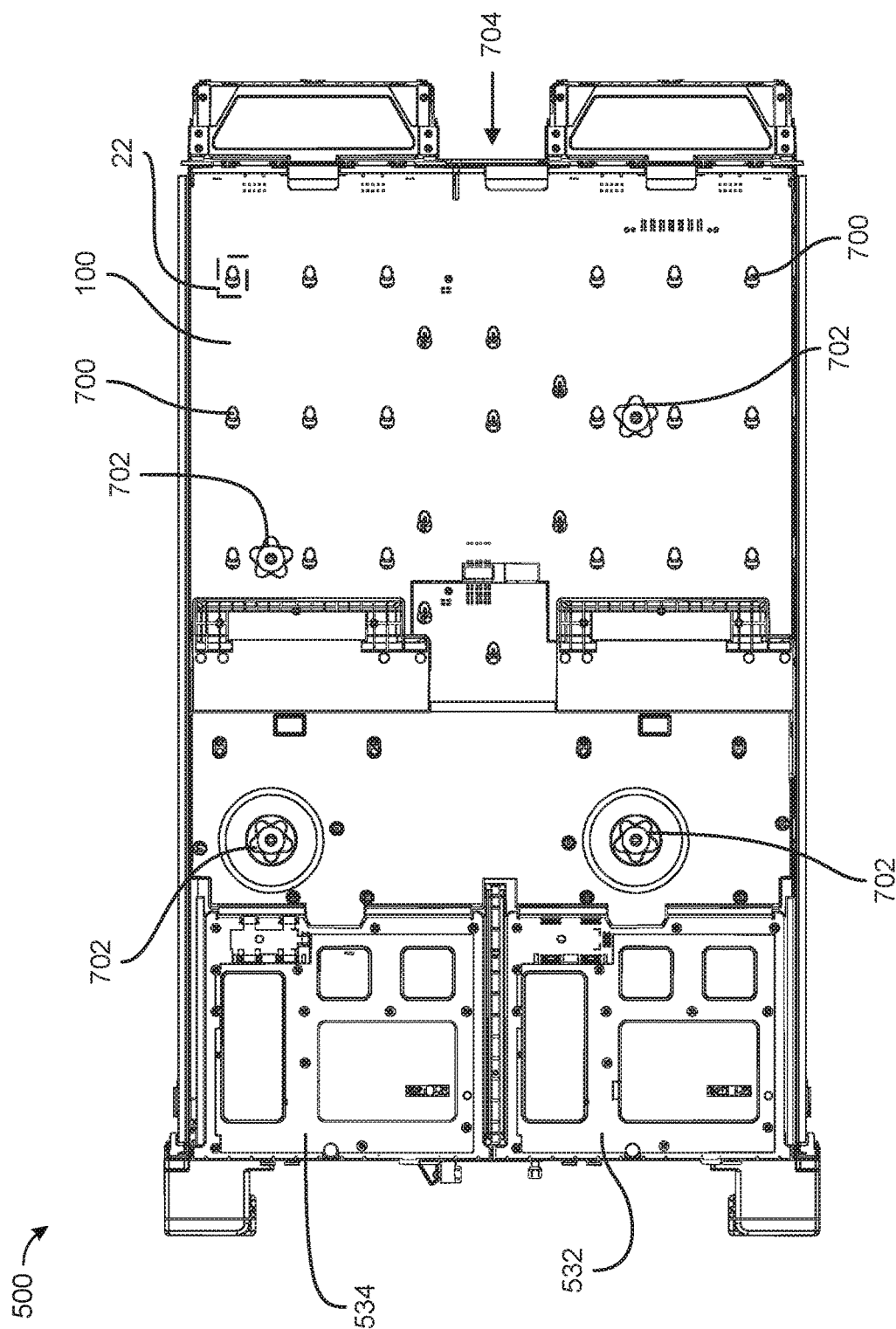
FIG. 7 is a bottom view of the exemplary storage-system drawer illustrated in FIG. 5.
Figure 8:
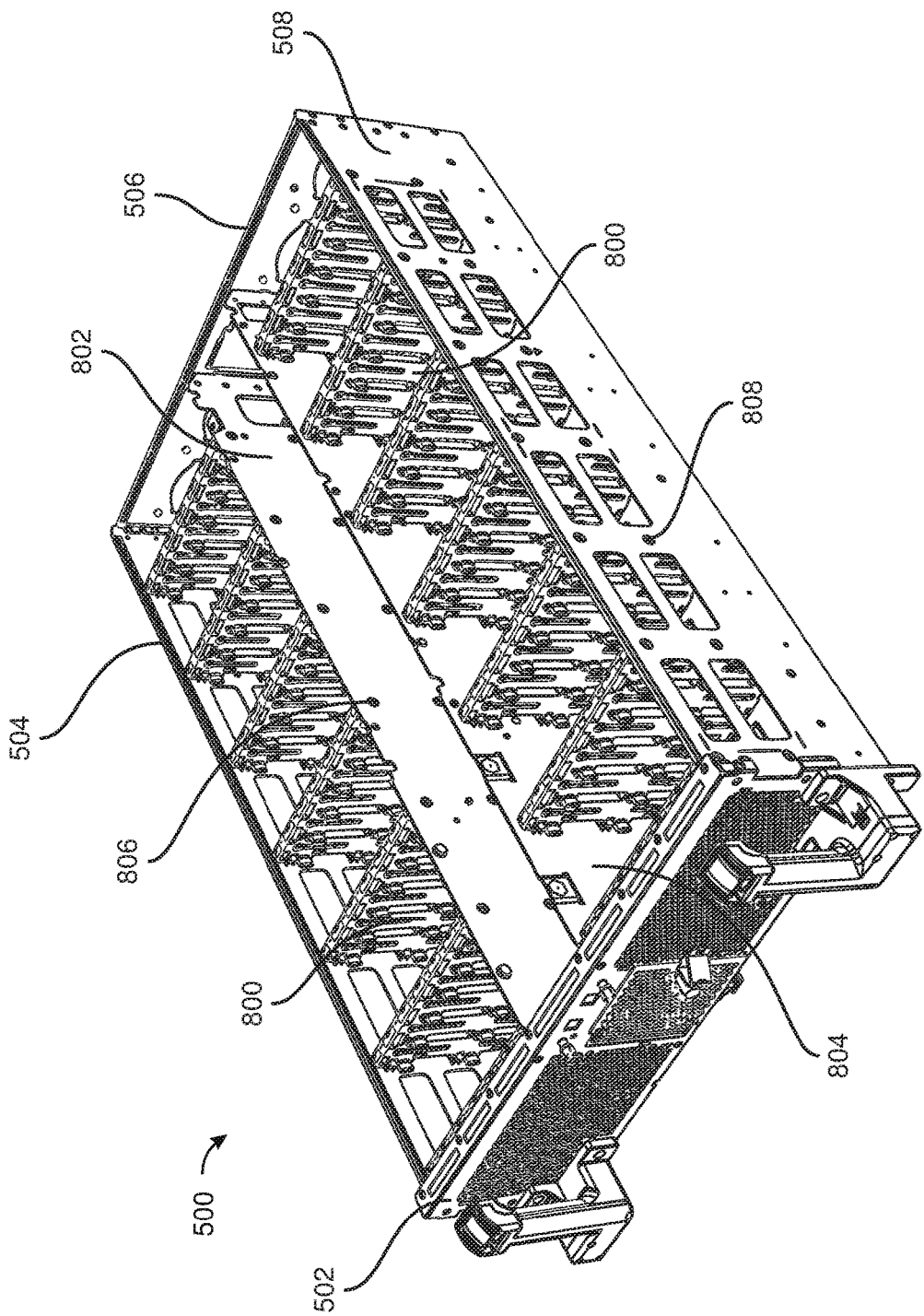
FIG. 8 is a simplified perspective view of the exemplary storage-system drawer illustrated in FIG. 5 with exemplary multi-purpose storage-system partitions.

As shown in FIG. 1, drive-plane board 100 may include keyhole openings 105 that are configured to interlock with keyhole fasteners of one or more multi-purpose storage-system partitions, such as multi-purpose storage-system partitions 800 in FIG. 8, that are contained within a storage-system chassis within which drive-plane board 100 may be removably installed. Drive-plane board 100 may have few additional elements other than those illustrated in FIG. 1. In some examples, as shown in FIG. 2, a bottom 202 of drive-plane board 100 may include holes 204 that are sized to receive screws (e.g., screws 702 shown in FIG. 7) that couple drive-plane board 100 to a storage system drawer and rails 206 that are configured to secure an I/O-module drawer containing an I/O module. As illustrated in FIG. 3, drive-board 100 may be made up of one or more separable pieces. In the example shown, drive-board 100 may include front PCB 302 and a rear PCB 304 that may be electrically coupled via high-speed connectors 306-312. In some examples, high-speed connectors 306-312 may provide power and communication pathways between the components of front PCB 302 and the components of rear PCB 304.

Figure 5:
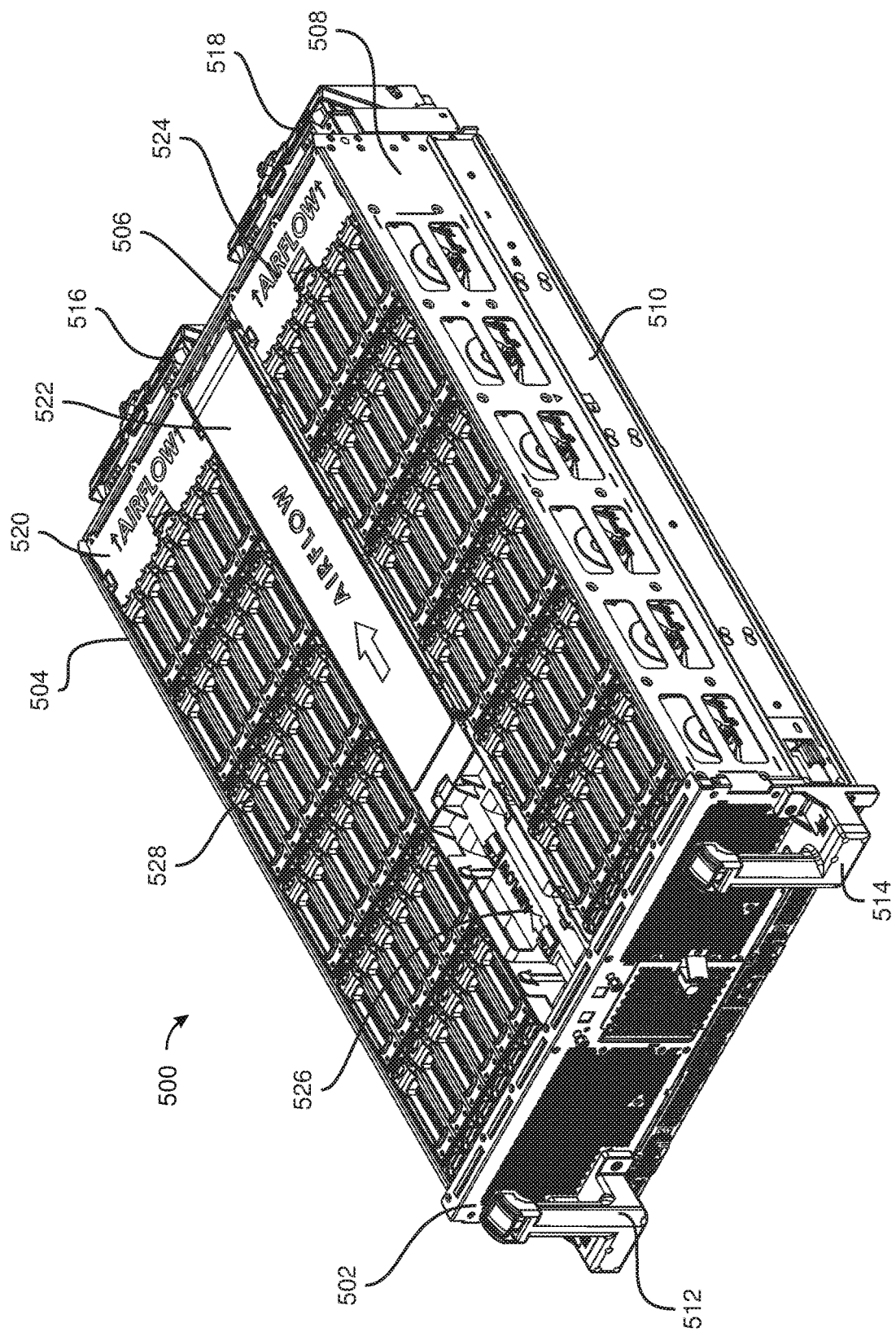
FIG. 5 is a perspective view of an exemplary storage-system drawer.
Figure 6:
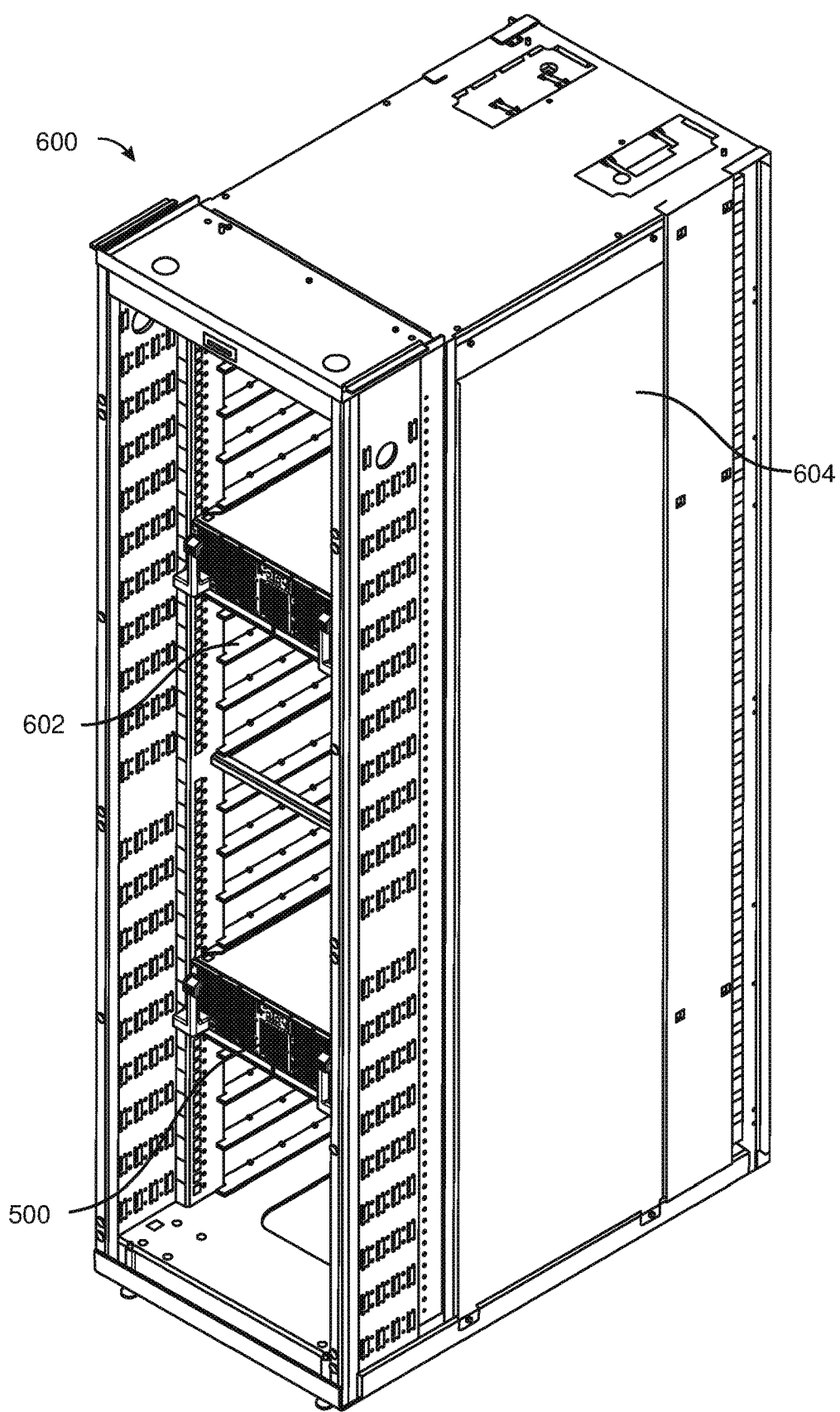
FIG. 6 is a perspective view of an exemplary data-center rack with several storage-system drawers.

FIG. 5 shows a perspective view of a storage-system drawer 500. The term "storage-system drawer," as used herein, generally refers to any structure that is adapted to house the various components that make up a storage system. As illustrated in FIG. 5, storage-system drawer 500 may include a chassis (e.g., a metallic enclosure) made up of a front 502, a left side 504, a rear 506, and a right side 508. The chassis of storage-system drawer 500 may be adapted to be housed in a data-center rack 600 as illustrated in FIG. 6. In one example, storage-system drawer 500 may be positioned on a support tray (such as support tray 602) coupled to a frame 604 of data-center rack 600. As used herein, the term "data-center rack" generally refers to any multi-system chassis structure for housing multiple storage-system drawers and chassis and/or providing support for one or more cables that connect to the storage-system drawers and chassis. In some examples, a data-center rack may also contain power supplies, network switches, and/or battery backup units.

Returning to FIG. 5, storage-system drawer 500 may include slide mechanisms (e.g., drawer-slide mechanism 510) that are coupled to left side 504 and right side 508 and enable storage-system drawer 500 to be fully extended out of data-center rack 600 for servicing. As shown, storage-system drawer 500 may include pull-handle 512 and pull-handle 514 configured to enable a technician to easily pull storage-system drawer 500 out from and return storage-system drawer 500 to data-center rack 600.

In some examples, the chassis of storage-system drawer 500 may be sized to house all of the storage-system components illustrated in FIG. 4. As shown in FIG. 5, storage-system drawer 500 may be configured so that most of the storage-system components that are contained within storage-system drawer 500 may be serviced through the top side of storage-system drawer 500. For example, each storage drive contained in storage-system drawer 500 may be secured within storage-system drawer 500 via a latch (e.g., a latch 528) adapted to hold the storage drive in place when closed and enable removal of the storage drive when open. In some embodiments, storage-system drawer 500 may include one or more removable covers (e.g., removable covers 520, 522, 524, and 526) that cover and provide access to other components contained within storage-system drawer 500, such as a compute module, a storage-controller card, and/or cables.

Additionally or alternatively, storage-system drawer 500 may be configured so that some of the storage-system components that are contained within storage-system drawer 500 may be serviced through the front, the bottom, or the rear of storage-system drawer 500. For example, storage-system drawer 500 may include a fan module 516 and a fan module 518 removably attached to rear 506. In some examples, fan module 516 and fan module 518 may include one or more fans that pull an airflow rearward through the chassis of storage-system drawer 500 for the purpose of cooling the storage-system components housed within storage-system drawer 500.

Figure 22:
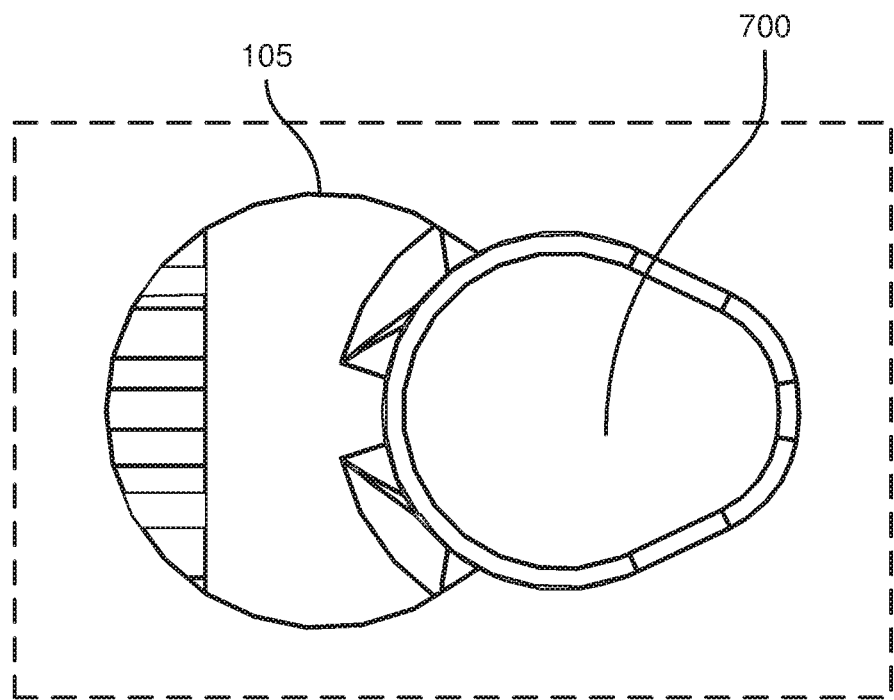
FIG. 22 is a close-up view of an exemplary keyhole opening interlocked with an exemplary keyhole fastener.

FIG. 7 shows a bottom view of an open bottom 704 of storage-system drawer 500 with drive-plane board 100 installed. As shown, keyhole fasteners 700 and screws 702 may retain drive-plane board 100 within storage-system drawer 500. A close-up view of this interlocked position is shown in FIG. 22. Screws 702 may be configured to screw into screw holes of one or more multi-purpose storage-system partitions, such as multi-purpose storage-system partitions 800 shown in FIG. 8, and align the multi-purpose storage-system partitions, and the storage drives they retain, with drive-plane board 100 and storage-drive connectors 104. In some examples, screws 702 may be thumbscrews. In some examples, keyhole fasteners 700 may be part of several multi-purpose storage-system partitions, such as multi-purpose storage-system partitions 800 shown in FIG. 8, that are coupled to the chassis of storage-system drawer 500.

FIG. 8 shows a simplified perspective view of storage-system drawer 500. As shown, storage-system drawer 500 may include several multi-purpose storage-system partitions 800. Each of multi-purpose storage-system partitions 800 may be adapted to perform several functions within storage-system drawer 500. For example, each of multi-purpose storage-system partitions 800 may include one or more of keyhole fasteners 700 that are configured to interlock with keyhole openings 105 of drive-plane board 100. Additionally or alternatively, each of multi-purpose storage-system partitions 800 may include storage-drive contact points that are adapted to retain carrierless storage drives within storage-system drawer 500. In some examples, each of multi-purpose storage-system partitions 800 may be adapted to retain one side of six front storage drives and one side of six rear storage drives.

As shown in FIG. 8, storage-system drawer 500 may include chassis partitions 802 and 804 that partition the chassis of storage-system drawer 500 into several compartments. In some examples, each of left side 504, right side 508, chassis partition 802, and chassis partition 804 may include counterbore screw holes, such as counterbore screw holes 806 and 808, that are spaced to ensure that each of multi-purpose storage-system partitions 800 are properly spaced within storage-system drawer 500 and properly aligned to drive-plane board 100 to allow for proper fittings of storage drives 402. In this example, each of multi-purpose storage-system partitions 800 may be coupled, via custom shoulder screws, to a side of the chassis of storage-system drawer 501 and one of chassis partitions 802 and 804. In this configuration, multi-purpose storage-system partitions 800 may provide structural support for the chassis of storage-system drawer 500. In some examples, multi-purpose storage-system partitions 800 may be made from light weight materials, such as light-weight plastic.

Figure 9:
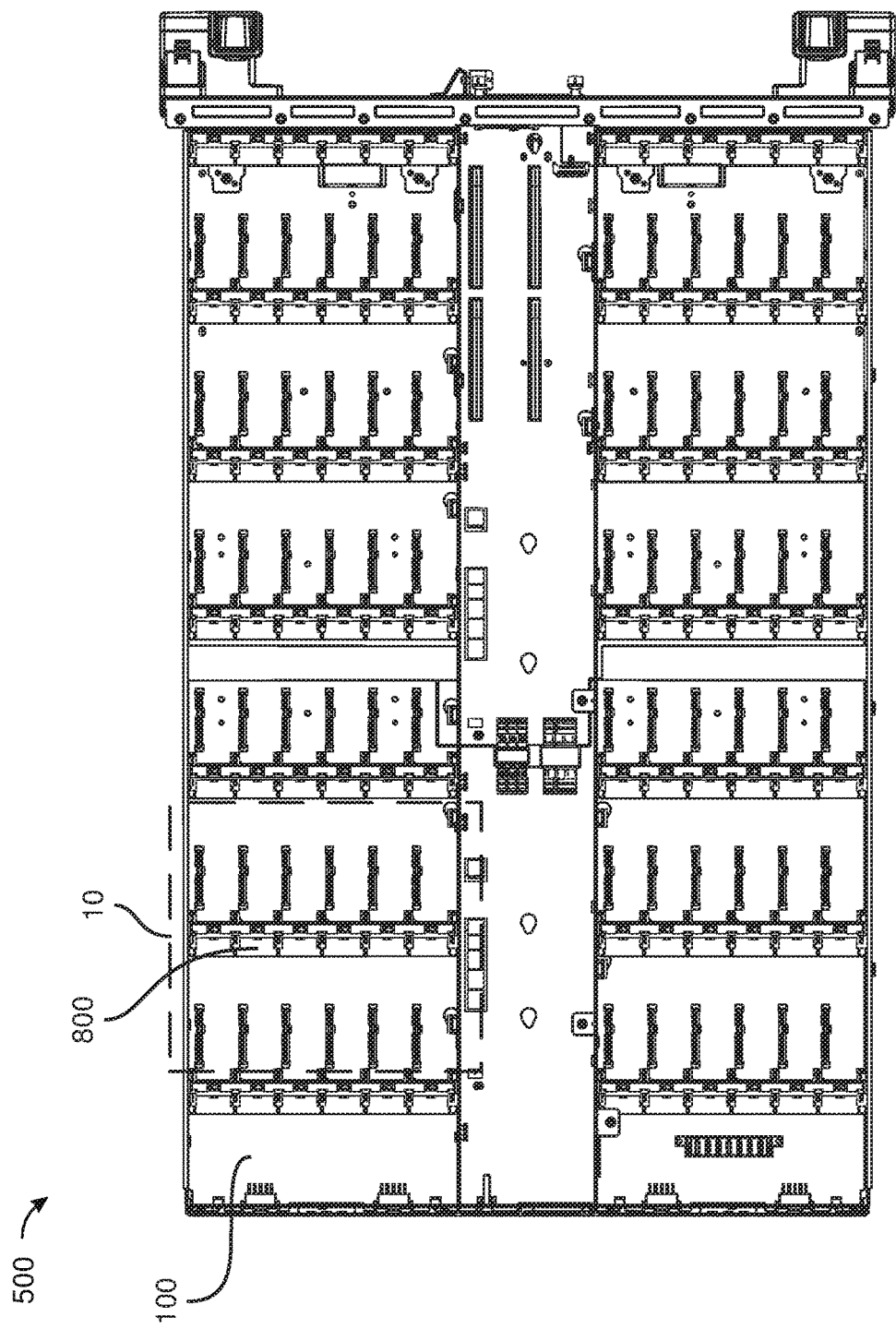
FIG. 9 is a simplified top view of the exemplary storage-system drawer illustrated in FIG. 5 showing another view of the exemplary multi-purpose storage-system partitions illustrated in FIG. 8.
Figure 10:
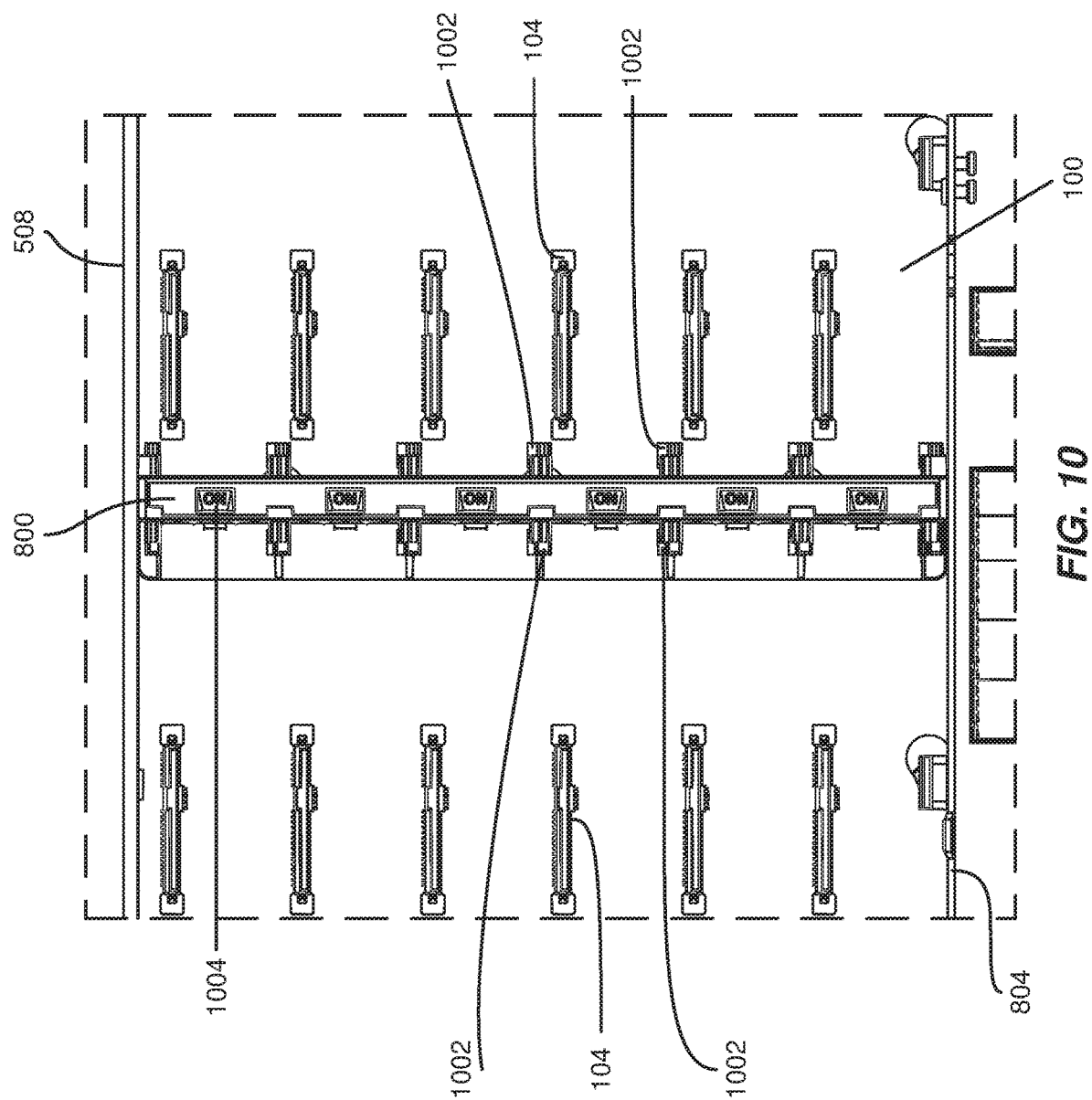
FIG. 10 is a close-up top view of one of the exemplary multi-purpose storage-system partitions illustrated in FIG. 8.

FIGS. 9 and 10 show a simplified top view of storage-system drawer 500 and a close-up view of the top view of storage-system drawer 500, respectively. In these figures, the positions of multi-purpose storage-system partitions 800 may be seen in relation to drive-plane board 100. As shown in FIG. 10, multi-purpose storage-system partition 800 may be coupled to right side 508 of storage-system drawer 500 and chassis partition 804. Multi-purpose storage-system partition 800 may include storage-drive contact points 1002 that are configured to align carrierless storage drives with storage-drive connectors 104 of drive-plane board 100, as shown. In some examples, all or a portion of multi-purpose storage-system partition 800 may be formed from translucent material and may glow to serve as an indicator of the state of one or more of the storage drives retained by multi-purpose storage-system partition 800. As shown in FIG. 10, multi-purpose storage-system partition 800 may include an indicator, such as indicator 1004, that may act as a conspicuous indicator of the state of an adjacent storage drive. In some examples, all or a portion of indicator 1004 may be formed from a transparent or translucent material to allow light from a light-emitting diode (LED) to pass through the indicator. Indicator 1004 may be part of or be positioned at a distal end of a light pipe (e.g., one of light pipes 2018 illustrated in FIGS. 20 and 24), and an LED may be positioned at a proximal end of the light pipe. Multi-colored LEDs (or multiple LEDs) may be used to cause the indicator to glow different colors to indicate different states (e.g., green may indicate that a drive is fully operational, amber may indicate that a drive needs to be serviced, etc.).

Figure 11:
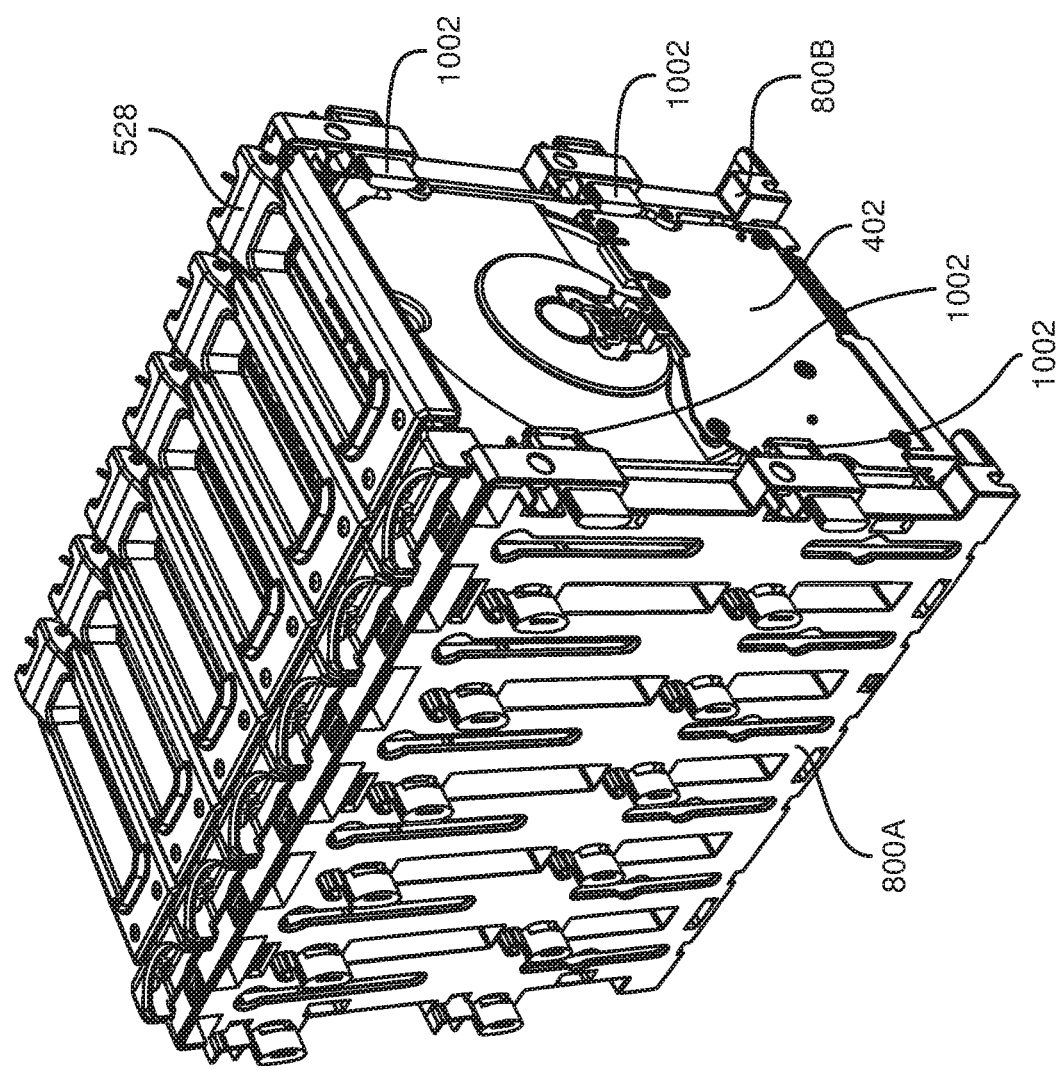
FIG. 11 is a perspective view of two of the exemplary multi-purpose storage-system partitions illustrated in FIG. 8 while retaining storage drives.
Figure 12:
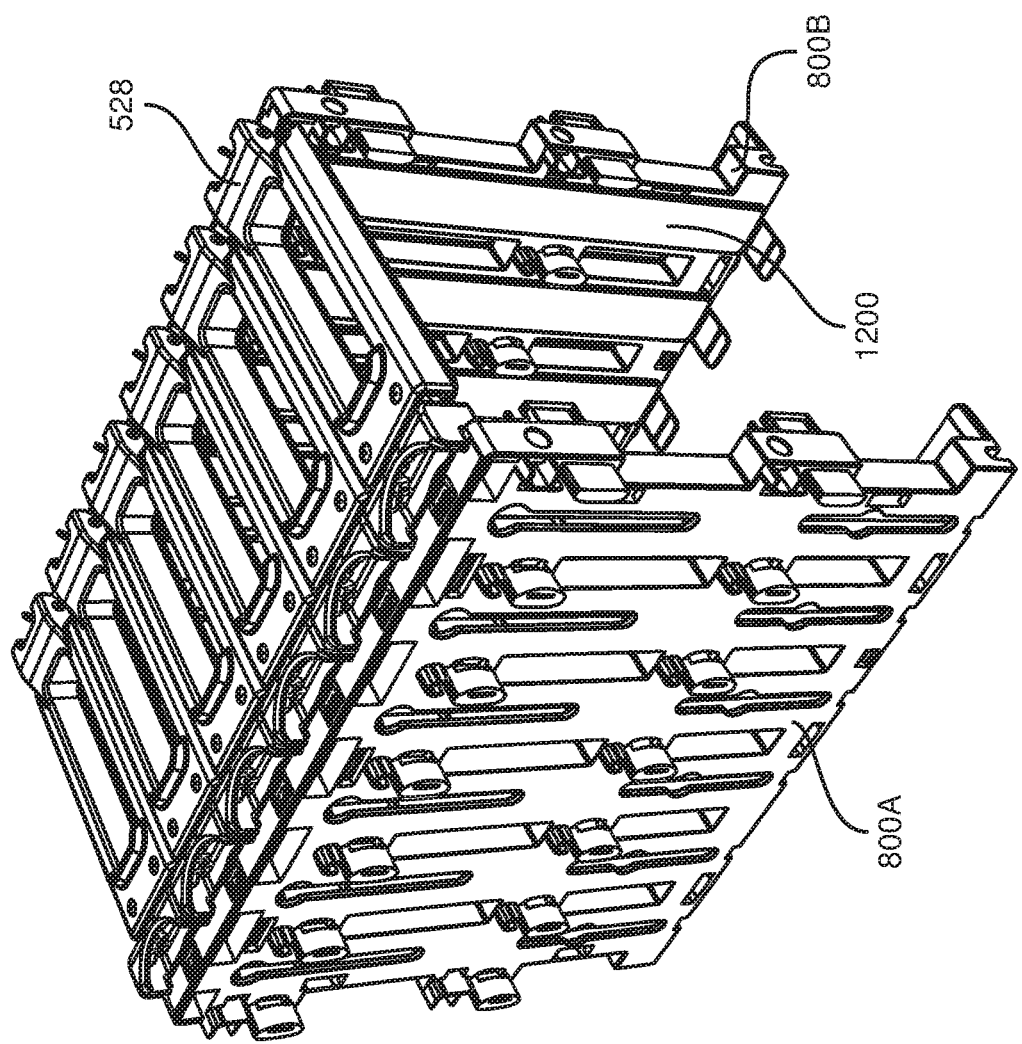
FIG. 12 is a perspective view of the exemplary multi-purpose storage-system partitions illustrated in FIG. 11 without the storage drives.

FIGS. 11 and 12 show perspective views of a multi-purpose storage-system partition 800A and a multi-purpose storage-system partition 800B. In FIG. 11, multi-purpose storage-system partition 800A and multi-purpose storage-system partition 800B are shown retaining six storage drives. In this example, six latch mechanisms, such as latch 528, are attached to multi-purpose storage-system partition 800B and retain the top sides of the storage drives. In this example, each of multi-purpose storage-system partition 800A and multi-purpose storage-system partition 800B may include several contact points, such as contact points 1002, that retain the front and back of each of the storage drives. In some examples, one or more drive-unseating mechanisms, such as drive-unseating mechanism 1200 in FIG. 12, may be coupled to each of multi-purpose storage-system partitions 800A and 800B. In some examples, the opening of latch 528 may lift drive-unseating mechanism 1200 that may be positioned under storage drive 402, and drive-unseating mechanism 1200 may lift storage drive 402 sufficiently high enough to unseat storage drive 402 from its corresponding storage-drive connector 104.

Figure 13:
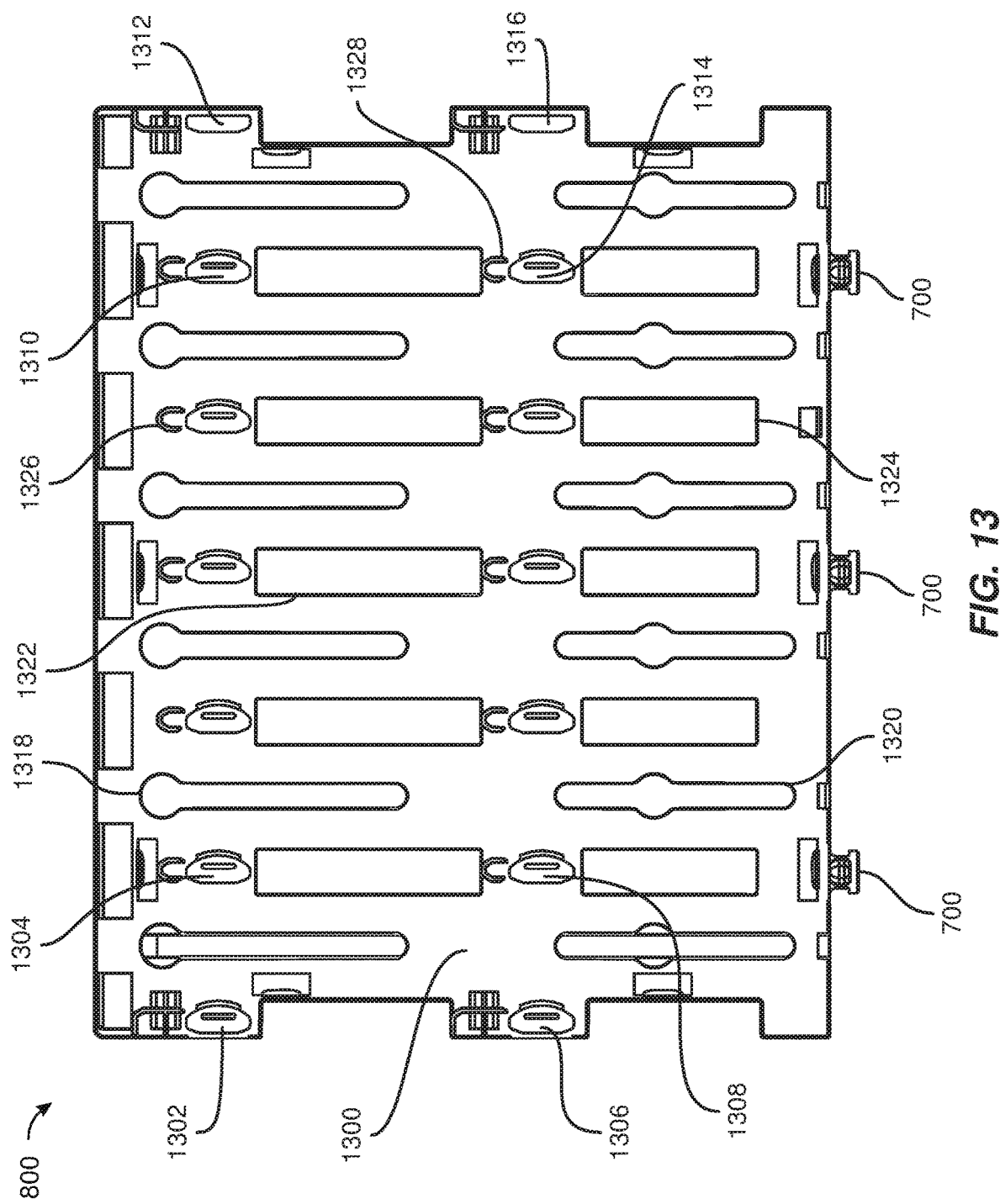
FIG. 13 is a front view of one of the exemplary multi-purpose storage-system partitions illustrated in FIG. 8.
Figure 14:
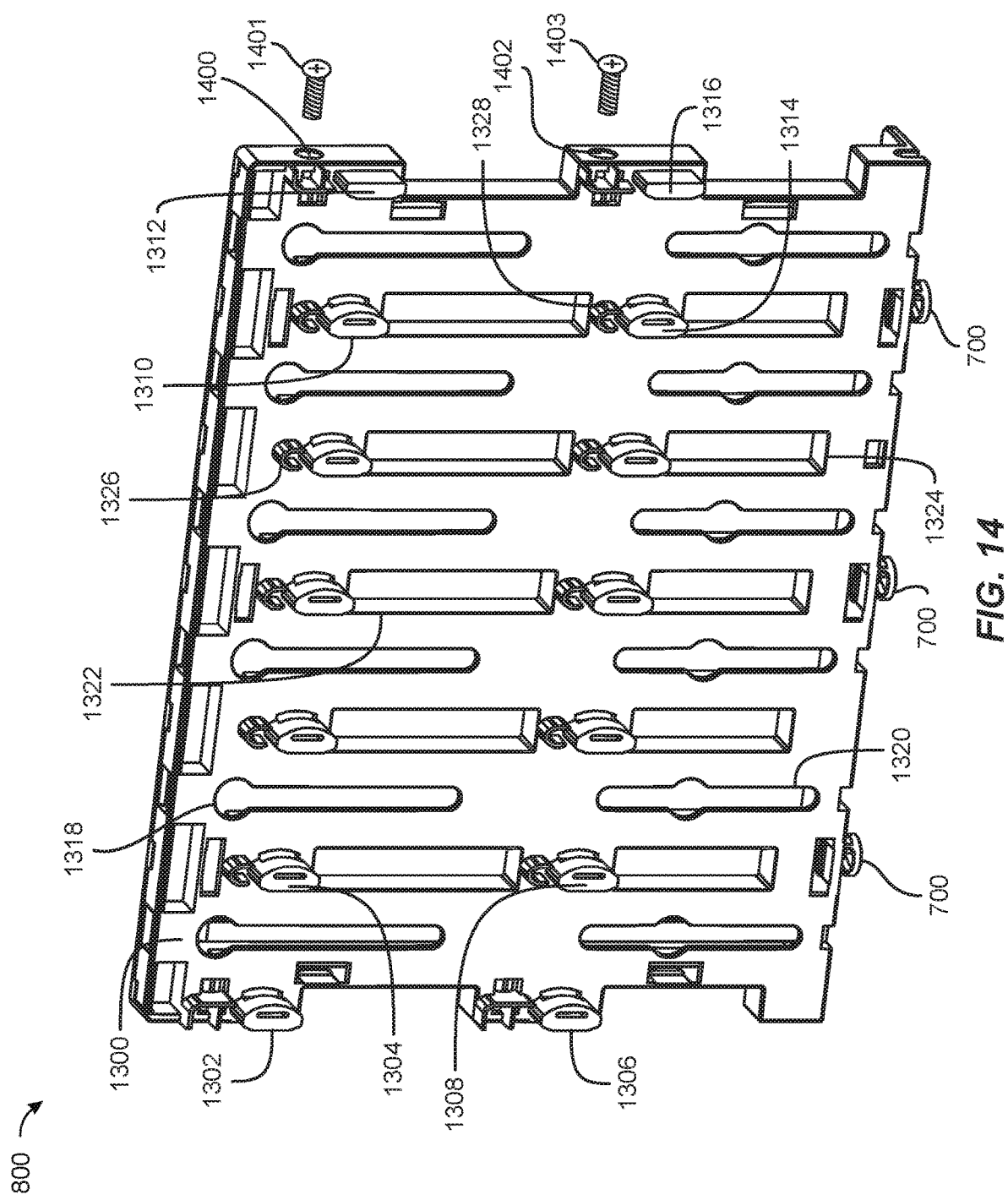
FIG. 14 is a perspective view of a front of one of the exemplary multi-purpose storage-system partitions illustrated in FIG. 8.

FIGS. 13 and 14 show a front view and a perspective view of a front 1300 of a multi-purpose storage-system partition 800, respectively. As shown in these figures, front 1300 may include various storage-drive contact points for retaining carrierless storage drives (e.g., standard storage drives without any additional carrier mechanisms) within storage-system drawer 500. In this example, storage-drive contact points 1302-1308 may be adapted to contact and retain the front and back of one side of a storage drive. Likewise, storage-drive contact points 1310-1316 may be adapted to contact and retain the front and back of one side of another storage drive. In these examples, storage-drive contact points 1302-1308 may be spaced to easily accept a storage drive and/or prevent the storage drive from moving relative to multi-purpose storage-system partition 800. Storage-drive contact points 1302-1308 may also apply a clamping force to the storage-drive and/or may dampen the motion of the storage drive relative to multi-purpose storage-system partition 800 and storage-system drawer 500. Storage-drive contact points 1302-1316 may be made of any suitable material. In some examples, storage-drive contact points 1302-1316 may be made of suitable shock-absorbing material, such as a synthetic rubber.

As shown in FIGS. 13 and 14, front 1300 of multi-purpose storage-system partition 800 may include various holes and/or openings. For example, multi-purpose storage-system partition 800 may include keyhole openings 1318 and 1320 configured to receive and retain a drive-unseating mechanism (e.g., drive-unseating mechanism 1200 in FIG. 12). Multi-purpose storage-system partition 800 may also include vents 1322 and 1324 that enable air to pass through multi-purpose storage-system partition 800, the storage drives retained by multi-purpose storage-system partition 800, and storage-system drawer 500. In some examples, multi-purpose storage-system partition 800 may include various features for helping a technician align storage drives with the contact points of multi-purpose storage-system partition 800. For example, multi-purpose storage-system partition 800 may include alignment protrusions, such as protrusions 1326 and 1328, located above each contact point of multi-purpose storage-system partition 800. In some examples, these protrusions may help align a storage drive to multi-purpose storage-system partition 800 as it is being inserted into storage-system drawer 500. As can be seen in these figures, multi-purpose storage-system partition 800 may also include three keyhole fasteners 700 that may be configured to retain removable drive-plane board 100 within storage-system drawer 500. As can be seen in FIG. 14, multi-purpose storage-system partition 800 may also include screw holes, such as screw holes 1400 and 1402, that accept screws, such as screws 1401 and 1403, that couple multi-purpose storage-system partition 800 to storage-system drawer 500.

Figure 15:
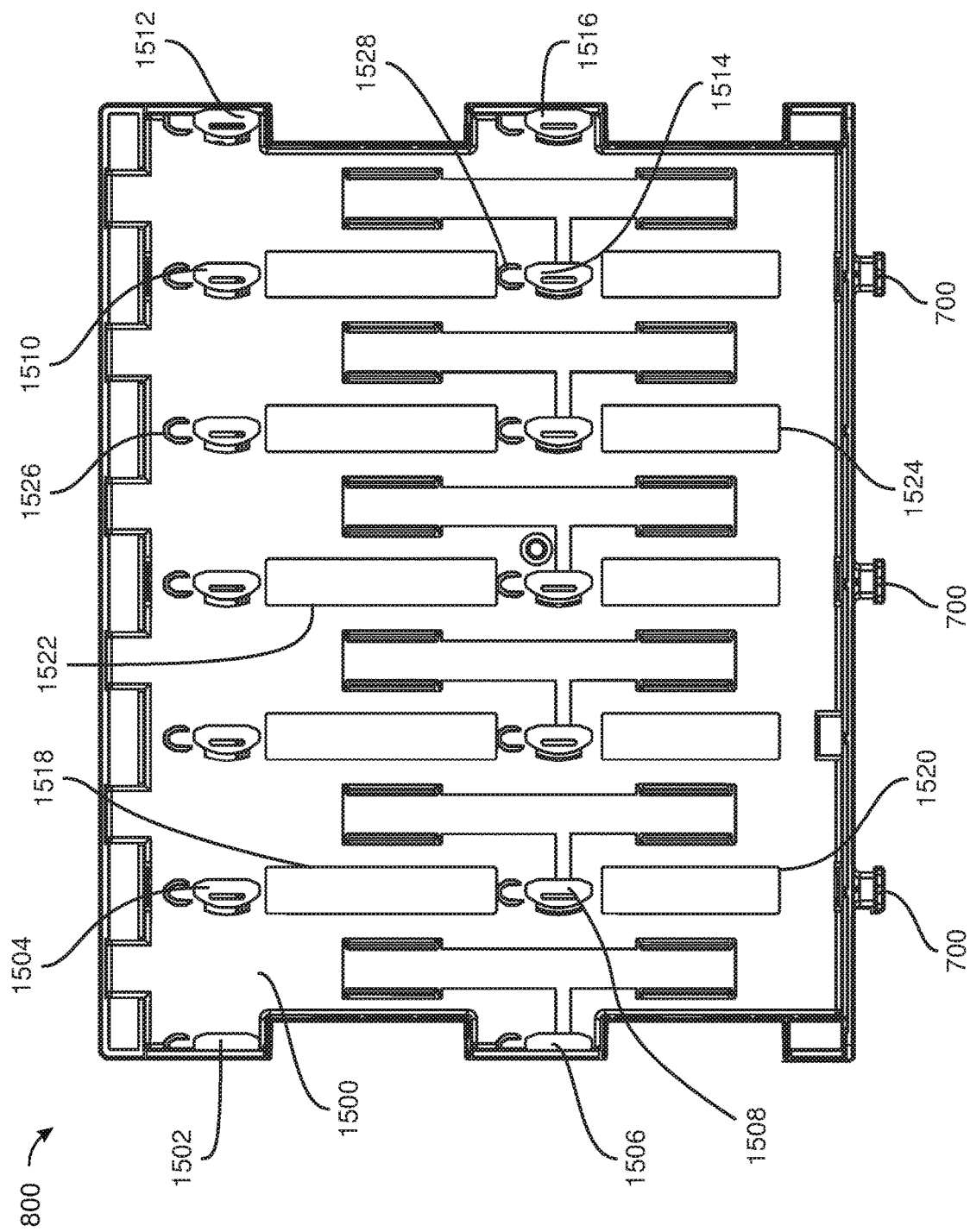
FIG. 15 is a rear view of one of the exemplary multi-purpose storage-system partitions illustrated in FIG. 8.
Figure 16:
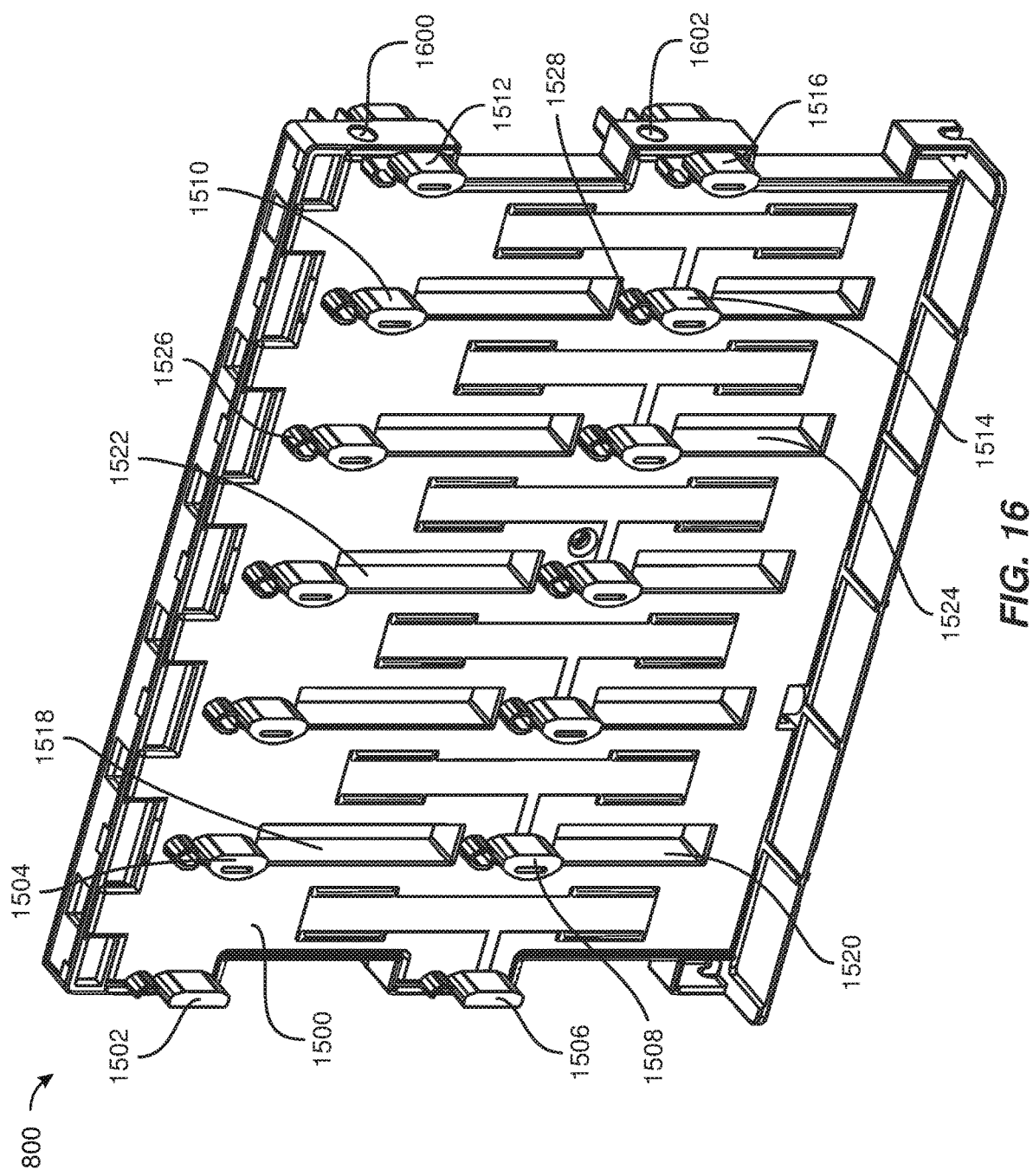
FIG. 16 is a perspective view of a rear of one of the exemplary multi-purpose storage-system partitions illustrated in FIG. 8.

FIGS. 15 and 16 show a rear view and a perspective view of a rear 1500 of a multi-purpose storage-system partition 800, respectively. As shown in these figures, rear 1500 may include various storage-drive contact points for retaining carrierless storage drives within storage-system drawer 500. In this example, storage-drive contact points 1502-1508 may be adapted to contact and retain the front and back of one side of a storage drive. Likewise, storage-drive contact points 1510-1516 may be adapted to contact and retain the front and back of one side of another storage drive. In these examples, storage-drive contact points 1502-1508 may be spaced to easily accept a storage drive and/or prevent the storage drive from moving relative to multi-purpose storage-system partition 800. Storage-drive contact points 1502-1508 may also apply a clamping force to the storage-drive and/or may dampen the motion of the storage drive relative to multi-purpose storage-system partition 800 and storage-system drawer 500. Storage-drive contact points 1502-1516 may be made of any suitable material. In some examples, storage-drive contact points 1502-1516 may be made of suitable shock-absorbing material, such as a synthetic rubber.

As shown in FIGS. 15 and 16, rear 1500 of multi-purpose storage-system partition 800 may include various holes and/or openings. For example, multi-purpose storage-system partition 800 may include vents 1518, 1520, 1522, and 1524 that enable air to pass through multi-purpose storage-system partition 800, the storage drives retained by multi-purpose storage-system partition 800, and storage-system drawer 500. In some examples, multi-purpose storage-system partition 800 may include various features for helping a technician align storage drives with the contact points of multi-purpose storage-system partition 800. For example, multi-purpose storage-system partition 800 may include alignment protrusions, such as protrusions 1526 and 1528, located above each contact point of multi-purpose storage-system partition 800. In some examples, these protrusions may help align a storage drive to multi-purpose storage-system partition 800 as it is being inserted into storage-system drawer 500. As can be seen in FIG. 16, multi-purpose storage-system partition 800 may also include screw holes, such as screw holes 1600 and 1602, that accept screws that couple multi-purpose storage-system partition 800 to storage-system drawer 500.

Figure 17:
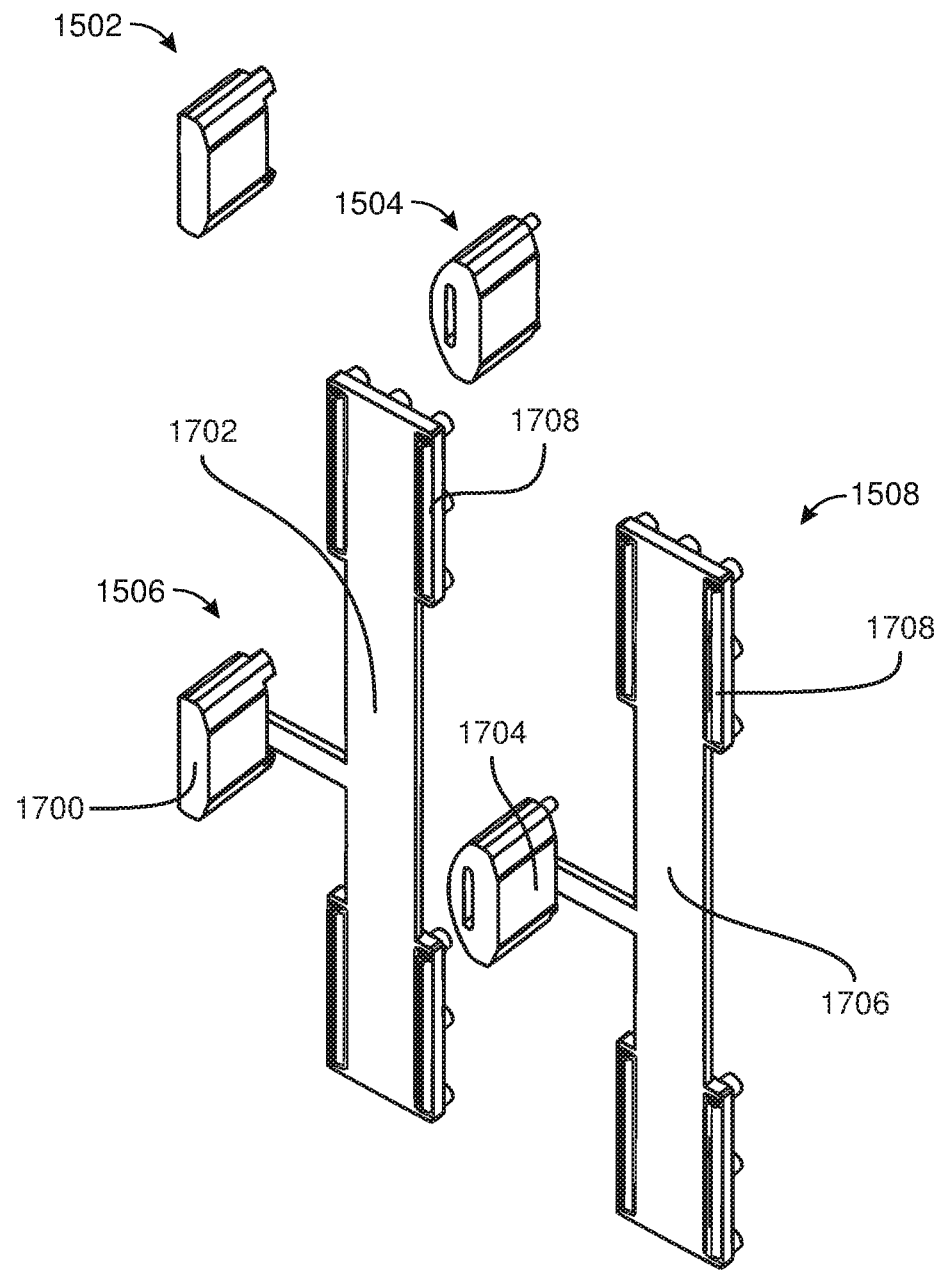
FIG. 17 is a perspective view of exemplary storage-drive contact points.
Figure 18:
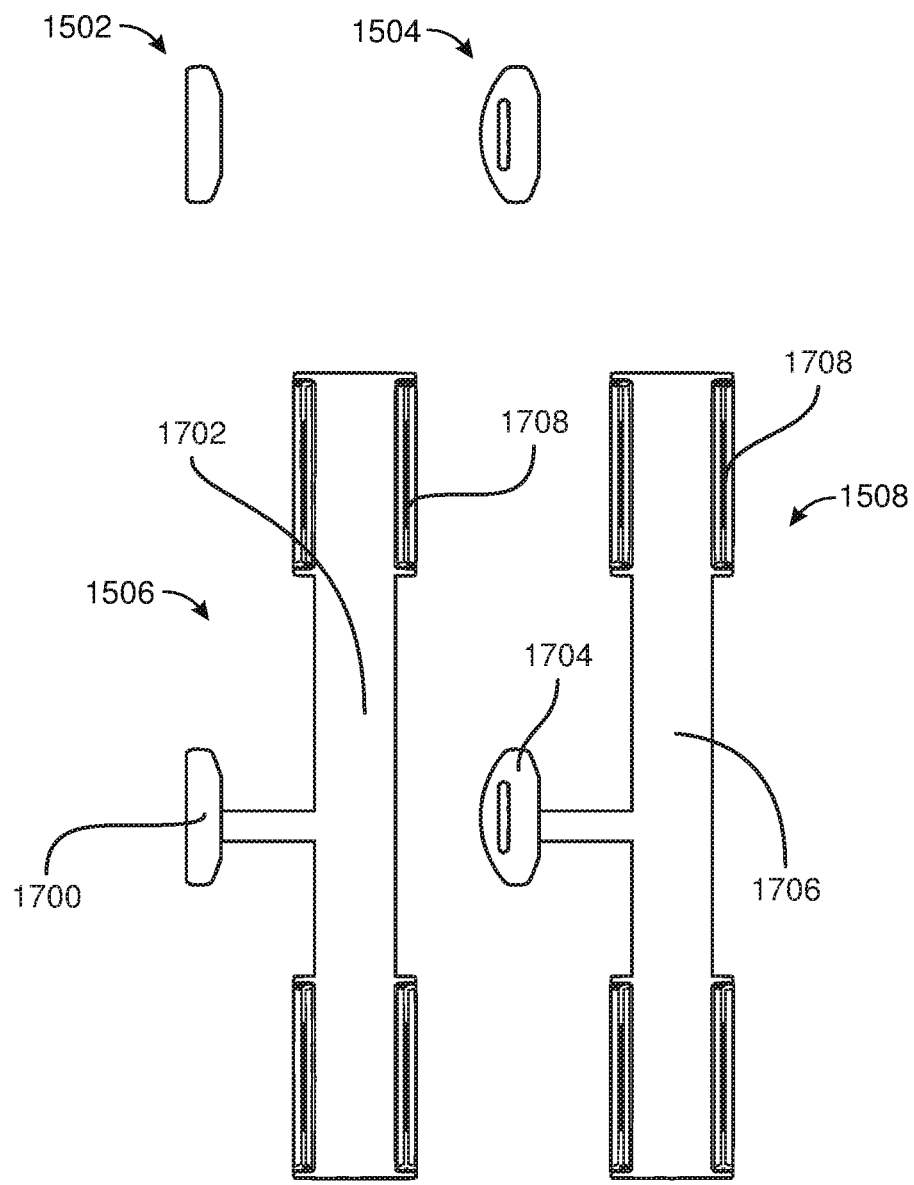
FIG. 18 is a front view of the exemplary storage-drive contact points illustrated in FIG. 17.

FIGS. 17 and 18 show a perspective view and a front view of storage-drive contact points 1502-1508, respectively. As shown in these figures, storage-drive contact point 1506 may include a nub 1700 with the same shape as storage-drive contact point 1502 and a planar portion 1702 with small protruding ridges (e.g., ridge 1708), and storage-drive contact point 1508 may include a nub 1704 with the same shape as storage-drive contact point 1504 and a planar portion 1706 with small protruding ridges (e.g., ridge 1708). In this example, each of planar portions 1702 and 1704 may be configured to apply a clamping force to the side of a storage-drive and/or dampen the motion of the storage drive relative to multi-purpose storage-system partition 800 and storage-system drawer 500.

Figure 19:
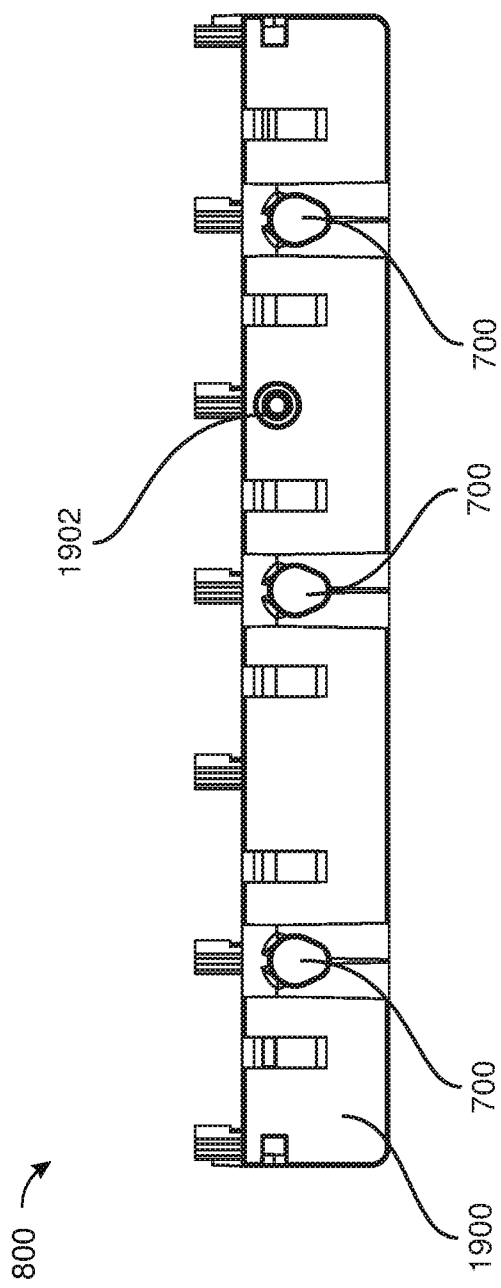
FIG. 19 is a bottom view of one of the exemplary multi-purpose storage-system partitions illustrated in FIG. 8.

FIG. 19 shows a bottom view of a bottom 1900 of multi-purpose storage-system partition 800. As shown, bottom 1900 may include three keyhole fasteners 700 that may be configured to retain removable drive-plane board 100 within storage-system drawer 500 and a screw hole 1902 that accepts one of screws 702 in FIG. 7 that couples drive-plane board 100 to storage-system drawer 500 and aligns multi-purpose storage-system partition 800 to drive-plane board 100 to allow for proper alignment of storage drives 402 to storage-drive connectors 104.

Figure 20:
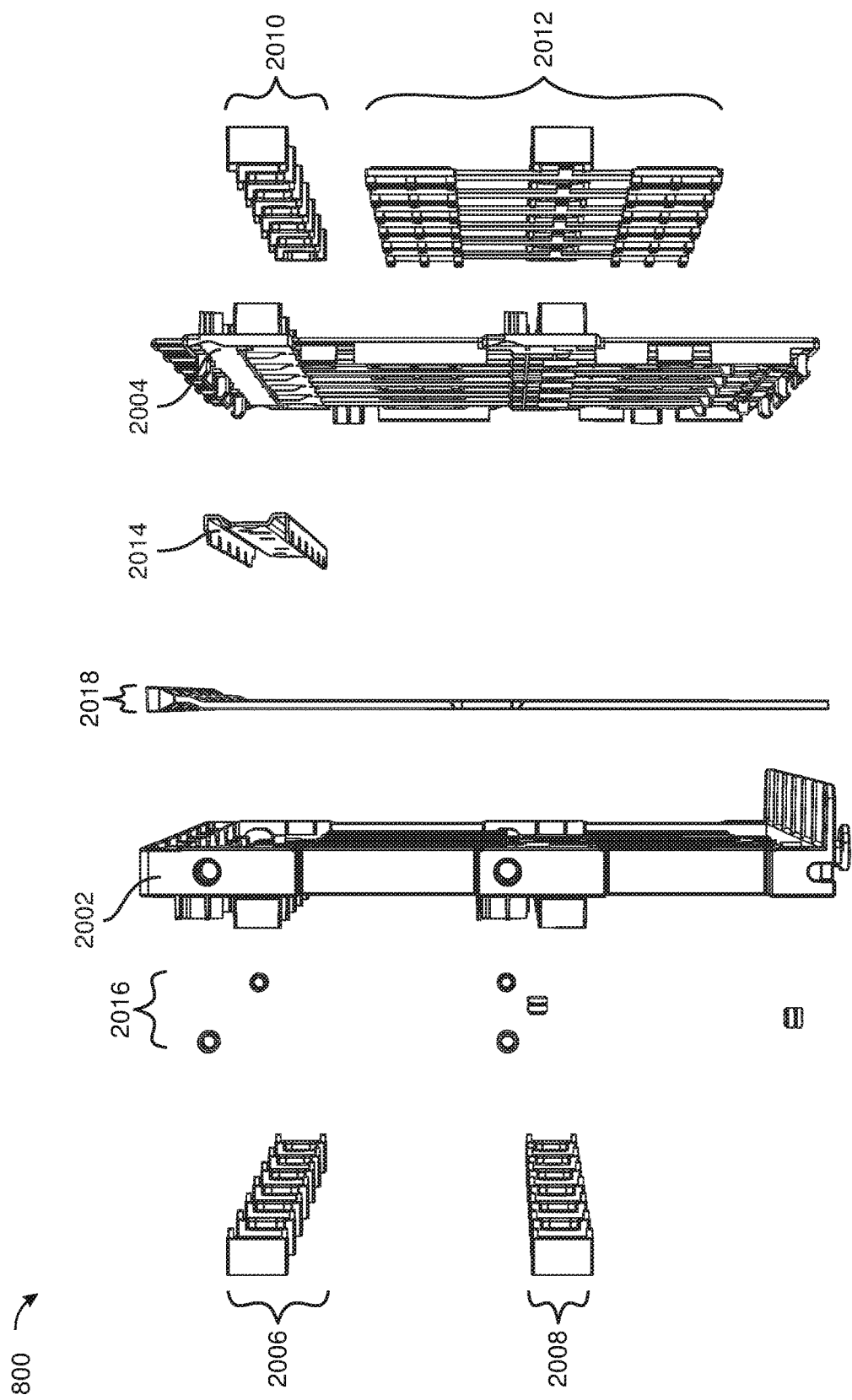
FIG. 20 is an exploded view of one of the exemplary multi-purpose storage-system partitions illustrated in FIG. 8.
Figure 21:
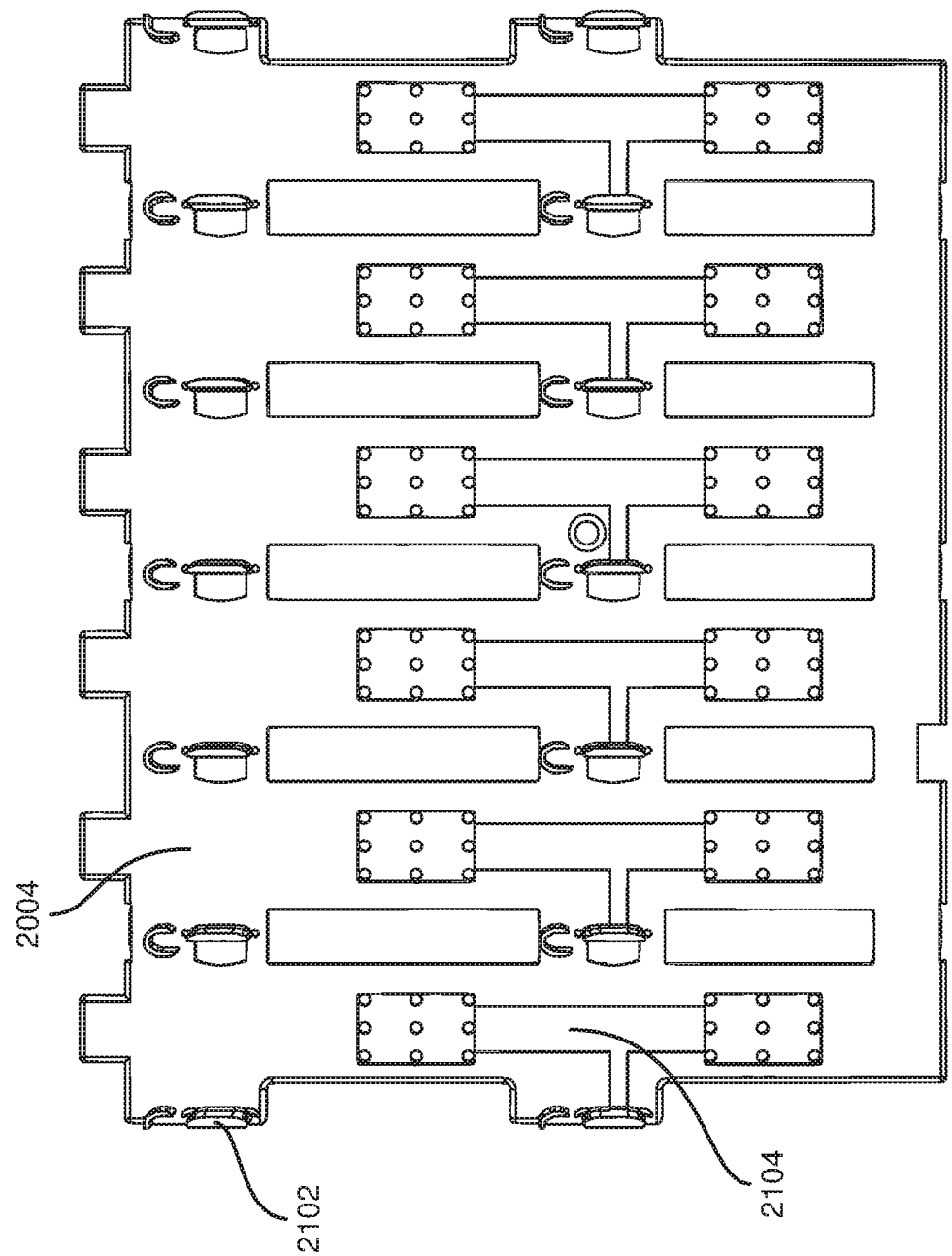
FIG. 21 is a front view of a portion of one of the exemplary multi-purpose storage-system partitions illustrated in FIG. 8.

FIG. 20 shows an exploded view of multi-purpose storage-system partition 800. As shown, multi-purpose storage-system partition 800 may include a front portion 2002, a rear portion 2004, upper storage-drive contact points 2006, lower storage-drive contact points 2008, upper storage-drive contact points 2010, lower storage-drive contact points 2012, brace 1214, screw-thread inserts 2016, and light pipes 2018. In some examples, front portion 2002, upper storage-drive contact points 2006, and lower storage-drive contact points 2008 may form a single injection-molded part. In one example, the injected-molded part may be a double-shot injection-molded part that includes a substantially rigid plastic portion and a synthetic rubber portion. In these examples, front portion 2002 may form the substantially rigid plastic portion, and upper storage-drive contact points 2006, and lower storage-drive contact points 2008 may form the synthetic rubber portion. Rear portion 2004, upper storage-drive contact points 2010, and lower storage-drive contact points 2012 may similarly form a single injection-molded part. As shown in FIG. 21, rear portion 2004 may include protrusions, such as protrusion 2102, around which upper storage-drive contact points 2010 may be formed and recesses, such as recess 2104, within which lower storage-drive contact points 2012 may be formed. In some examples, brace 1214 may be constructed from metal and affixed to front portion 2002 to provide structural support for multi-purpose storage-system partition 800.

In some examples, each of light pipes 2018 may act as part of an indicator light (indicator 1004 in FIG. 10) that indicates the state of a storage drive. In some examples, all or a portion of each light pipe may be formed from a transparent or translucent material to allow light from a light-emitting diode (LED) to pass through the light pipe. In some examples, an LED may be positioned at a proximal end of each of light pipes 2018. Multi-colored LEDs (or multiple LEDs) may be used to cause the light pipe to glow different colors to indicate different states (e.g., green may indicate that a drive is fully operational, amber may indicate that a drive needs to be serviced, etc.). A close-up perspective view of a light pipe 2018 is provided in FIG. 24.

Figure 23:
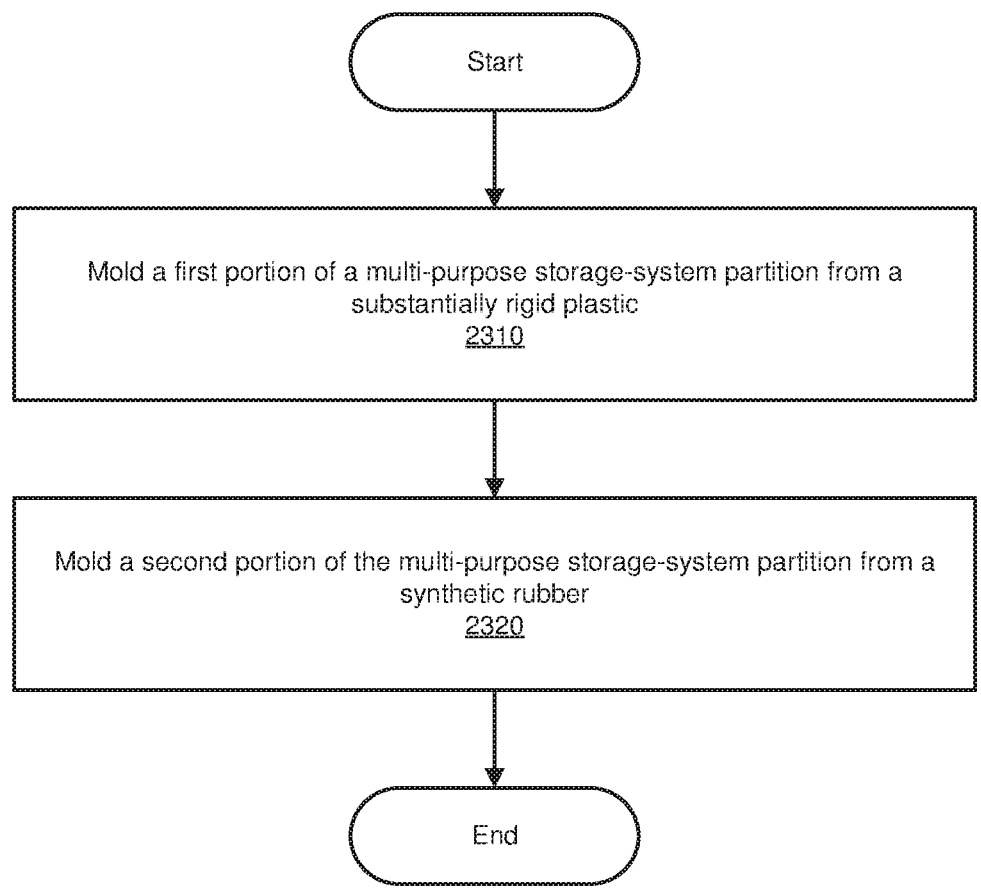
FIG. 23 is a flow diagram of an exemplary method for manufacturing a multi-purpose storage-system partition.
Figure 24:
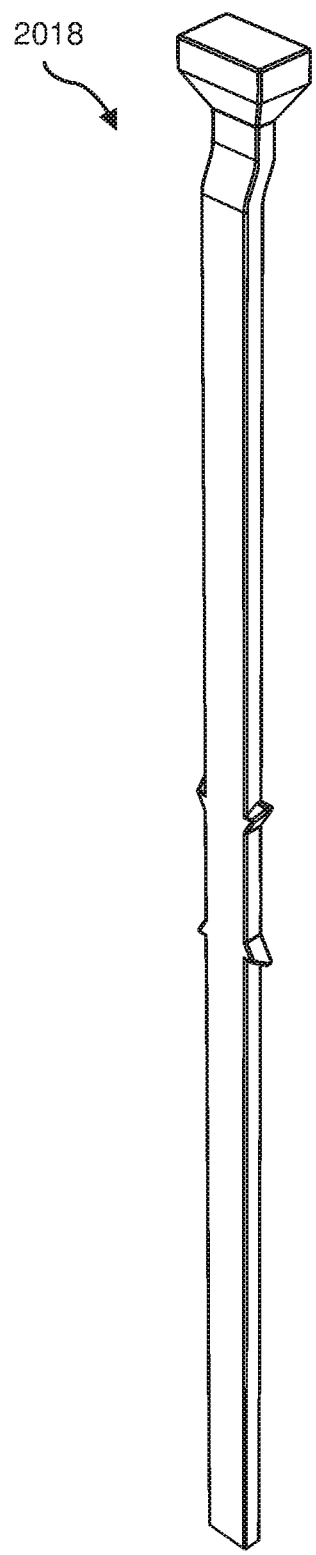
FIG. 24 is a close-up perspective view of an exemplary light pipe.

FIG. 23 shows, by way of example, a method for manufacturing portions of a multi-purpose storage-system partition via a double-shot injection-molding process. At step 2310, a first portion of a multi-purpose storage-system partition may be molded from a substantially rigid plastic. Using FIG. 20 as an example, front portion 2002 may be molded from a substantially rigid plastic. Rear portion 2004 may likewise be molded from a substantially rigid plastic.

At step 2320, a second portion of the multi-purpose storage-system partition may be molded from a synthetic rubber. Using FIG. 20 as an example, upper storage-drive contact points 2006 and lower storage-drive contact points 2008 may be molded around front portion 2002 from a synthetic rubber. Likewise, upper storage-drive contact points 2010 and lower storage-drive contact points 2012 may be molded around rear portion 2004 from synthetic rubber.

As explained above, the multi-purpose storage-system partitions disclosed herein may be used in a storage-system chassis to (1) secure carrierless storage drives within the storage-system chassis, (2) provide structural support for the storage-system chassis, and/or (3) provide attachment points for other removable storage-system components, such as a removable drive-plane board, within the storage-system chassis. The multi-purpose storage-system partitions disclosed herein may be lightweight double-shot injection-molded partitions that include rubber contact points that securely position carrierless storage drives within the storage-system chassis and provide shock and vibration dampening and isolation for the carrierless storage drives. The multi-purpose storage-system partitions disclosed herein may also include vertical openings that allow air to pass through the storage-system chassis and through the storage drives secured by the multi-purpose storage-system partitions.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A multi-purpose storage-system partition comprising:
a bottom comprising a keyhole fastener that is configured to:
   interlock with one of a plurality of keyhole openings of a removable drive-plane board having a front plurality of storage-drive connectors and a rear plurality of storage-drive connectors;
   retain the removable drive-plane board within a storage-system chassis having an open bottom, the keyhole fastener being oriented downward relative to the storage-system chassis; and
   enable, while the multi-purpose storage-system partition is coupled to the storage-system chassis, the removable drive-plane board to be installed to and removed from the storage-system chassis via the open bottom of the storage-system chassis;
a front comprising a front plurality of storage-drive contact points configured to:
   retain a front plurality of carrierless storage drives within the storage-system chassis; and
   align the front plurality of carrierless storage drives with the front plurality of storage-drive connectors;
a rear comprising a rear plurality of storage-drive contact points configured to:
   retain a rear plurality of carrierless storage drives within the storage-system chassis; and
   align the rear plurality of carrierless storage drives with the rear plurality of storage-drive connectors; and
a side comprising a fastener-retaining member configured to engage a fastener that couples the multi-purpose storage-system partition to a side of the storage-system chassis.

2. The multi-purpose storage-system partition of claim 1, wherein:
the front plurality of storage-drive contact points are configured to dampen movements of the front plurality of carrierless storage drives relative to movements of the storage-system chassis; and
the rear plurality of storage-drive contact points are configured to dampen movements of the rear plurality of carrierless storage drives relative to the movements of the storage-system chassis.

3. The multi-purpose storage-system partition of claim 1, wherein:
the front of the multi-purpose storage-system partition comprises a multi-shot injection-molded part, the multi-shot injection-molded part comprising a substantially rigid plastic portion and a synthetic rubber portion; and
the front plurality of storage-drive contact points are formed from the synthetic rubber portion.

4. The multi-purpose storage-system partition of claim 1, wherein:
the rear of the multi-purpose storage-system partition comprises a multi-shot injection-molded part, the multi-shot injection-molded part comprising a substantially rigid plastic portion and a synthetic rubber portion; and
the rear plurality of storage-drive contact points are formed from the synthetic rubber portion.

5. The multi-purpose storage-system partition of claim 1, wherein:
the multi-purpose storage-system partition comprises a multi-shot injection-molded part, the multi-shot injection-molded part comprising a substantially rigid plastic portion and a synthetic rubber portion; and
the keyhole fastener is formed from the substantially rigid plastic portion.

6. The multi-purpose storage-system partition of claim 1, wherein the multi-purpose storage-system partition comprises:
an injection-molded part; and
a metal bracket coupled to the injection-molded part and configured to stiffen the multi-purpose storage-system partition.

7. The multi-purpose storage-system partition of claim 1, wherein:
the storage-system chassis comprises a front through which air is able to pass and a rear through which air is able to pass;
a fan coupled to the storage-system chassis directs an airflow through the storage-system chassis from the front of the storage-system chassis to the rear of the storage-system chassis; and
the multi-purpose storage-system partition comprises at least one opening through which the airflow is able to pass.

8. The multi-purpose storage-system partition of claim 7, wherein the at least one opening comprises a plurality of slits, each of the plurality of slits being located between two of the front storage-drive contact points and configured to allow a portion of the airflow to flow between two of the front plurality of carrierless storage drives and two of the rear plurality of carrierless storage drives.

9. The multi-purpose storage-system partition of claim 1, wherein the multi-purpose storage-system partition comprises an additional plurality of keyhole openings, each of the additional plurality of keyhole openings configured to interlock with a keyhole fastener of a drive-unseating member.

10. A storage-system drawer comprising:
a chassis having an open bottom;
a removeable drive-plane board comprising:
   a plurality of keyhole openings;
   a front plurality of storage-drive connectors; and
   a rear plurality of storage-drive connectors; and
a multi-purpose storage-system partition coupled to the chassis, the multi-purpose storage-system partition comprising:
   a bottom comprising a keyhole fastener that is oriented downward relative to the chassis and configured to:
      interlock with one of the plurality of keyhole openings of the removable drive-plane board;
      retain the removable drive-plane board within the chassis; and
      enable, while the multi-purpose storage-system partition is coupled to the chassis, the removable drive-plane board to be installed to and removed from the chassis via the open bottom of the chassis;
   a front comprising a front plurality of storage-drive contact points configured to:
      retain a front plurality of carrierless storage drives within the chassis; and
      align the front plurality of carrierless storage drives with the front plurality of storage-drive connectors; and
   a rear comprising a rear plurality of storage-drive contact points configured to:
      retain a rear plurality of carrierless storage drives within the chassis; and align the rear plurality of carrierless storage drives with the rear plurality of storage-drive connectors.

11. The storage-system drawer of claim 10, wherein:
the front plurality of storage-drive contact points are configured to dampen movements of the front plurality of carrierless storage drives relative to movements of the chassis; and
the rear plurality of storage-drive contact points are configured to dampen movements of the rear plurality of carrierless storage drives relative to the movements of the chassis.

12. The storage-system drawer of claim 10, wherein:
the front of the multi-purpose storage-system partition comprises a multi-shot injection-molded part, the multi-shot injection-molded part comprising a substantially rigid plastic portion and a synthetic rubber portion; and
the front plurality of storage-drive contact points are formed from the synthetic rubber portion.

13. The storage-system drawer of claim 10, wherein:
the rear of the multi-purpose storage-system partition comprises a multi-shot injection-molded part, the multi-shot injection-molded part comprising a substantially rigid plastic portion and a synthetic rubber portion; and
the rear plurality of storage-drive contact points are formed from the synthetic rubber portion.

14. The storage-system drawer of claim 10, wherein:
the multi-purpose storage-system partition comprises a multi-shot injection-molded part, the multi-shot injection-molded part comprising a substantially rigid plastic portion and a synthetic rubber portion; and
the keyhole fastener is formed from the substantially rigid plastic portion.

15. The storage-system drawer of claim 10, wherein the multi-purpose storage-system partition comprises:
an injection-molded part; and
a metal bracket coupled to the injection-molded part and configured to stiffen the multi-purpose storage-system partition.

16. The storage-system drawer of claim 10, wherein:
the multi-purpose storage-system partition comprises a side having a fastener-retaining member; and
the storage-system drawer comprises a fastener that is configured to engage the fastener-retaining member and couple the multi-purpose storage-system partition to a side of the chassis.

17. The storage-system drawer of claim 10, wherein:
the chassis comprises a front through which air is able to pass and a rear through which air is able to pass;
the storage-system drawer further comprises a fan coupled to the chassis that directs an airflow through the chassis from the front of the chassis to the rear of the chassis; and
the multi-purpose storage-system partition comprises at least one opening through which the airflow is able to pass.

18. The storage-system drawer of claim 10, wherein the at least one opening comprises a plurality of slits, each of the plurality of slits being located between two of the front storage-drive contact points and configured to allow a portion of the airflow to flow between two of the front plurality of carrierless storage drives and two of the rear plurality of carrierless storage drives.

19. The storage-system drawer of claim 10, wherein the multi-purpose storage-system partition comprises an additional plurality of keyhole openings, each of the additional plurality of keyhole openings configured to interlock with a keyhole fastener of a drive-unseating member.

20. A method comprising:
molding, as part of a multi-shot injection-molding process, a first portion of a multi-purpose storage-system partition from a substantially rigid plastic, the first portion of the multi-purpose storage-system partition comprising:
a bottom comprising a keyhole fastener configured to:
interlock with one of a plurality of keyhole openings of a removable drive-plane board having a front plurality of storage-drive connectors and a rear plurality of storage drive connectors;
retain the removable drive-plane board within a storage-system chassis having an open bottom; and
enable, while the multi-purpose storage-system partition is coupled to the storage-system chassis, the removable drive-plane board to be installed to and removed from the storage-system chassis via the open bottom of the storage-system chassis; and a side comprising a fastener-retaining member configured to engage a fastener that couples the multi-purpose-storage-system partition to a side of the storage-system chassis; and
molding, as part of the multi-shot injection-molding process, a second portion of the multi-purpose storage-system partition from a synthetic rubber, the second portion of the multi-purpose storage-system partition comprising:
a front plurality of storage-drive contact points configured to:
retain a front plurality of carrierless storage drives within the storage-system chassis; and
align the front plurality of carrierless storage drives with the front plurality of storage-drive connectors; and
retain a rear plurality of carrierless storage drives within the storage-system chassis; and
align the rear plurality of carrierless storage drives with the plurality of storage-drive connectors.

\* \* \* \* \*